(12) United States Patent
Kim et al.

(10) Patent No.: US 11,561,643 B2
(45) Date of Patent: Jan. 24, 2023

(54) ELECTRONIC DEVICE AND INTERFACE DEVICE INCLUDING THE SAME

(71) Applicant: Samsung Display Co., Ltd., Yongin-si (KR)

(72) Inventors: Yun-Ho Kim, Hwaseong-si (KR); Chui Kim, Hwaseong-si (KR); Wonsang Park, Yongin-si (KR); Jaeuk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/221,714

(22) Filed: Apr. 2, 2021

(65) Prior Publication Data

US 2022/0050569 A1 Feb. 17, 2022

(30) Foreign Application Priority Data

Aug. 12, 2020 (KR) .......................... 10-2020-0101182

(51) Int. Cl.
*G06F 3/041* (2006.01)
*G09G 3/20* (2006.01)
(Continued)

(52) U.S. Cl.
CPC ...... *G06F 3/04162* (2019.05); *G06F 3/03545* (2013.01); *G06F 3/0412* (2013.01); *G06F 3/0442* (2019.05); *G09G 3/2007* (2013.01); *G09G 3/2074* (2013.01); *G09G 3/32* (2013.01); *H01L 27/323* (2013.01); *H01L 27/3244* (2013.01); *G06F 2203/04106* (2013.01);
(Continued)

(58) Field of Classification Search
CPC ............. G06F 3/04162; G06F 3/03545; G06F 3/0412; G06F 3/0442; G06F 2203/04106; G06F 3/038; G06F 3/0383; G06F 3/0446; G06F 2203/0384; G06F 3/0416; G06F 3/0418; G09G 3/2007; G09G 3/2074; G09G 3/32; G09G 2340/14; G09G 2354/00; G09G 2360/16; G09G 2330/06; G09G 2310/027; H01L 27/323; H01L 27/3244; H01L 27/156; H01L 27/3225
See application file for complete search history.

(56) References Cited

U.S. PATENT DOCUMENTS 10,268,285 B2  4/2019  Jung et al.
10,606,389 B2  3/2020  Ju et al.
(Continued)

FOREIGN PATENT DOCUMENTS

KR  10-2017-0027243 A  3/2017

*Primary Examiner* — Julie Anne Watko
(74) *Attorney, Agent, or Firm* — Lewis Roca Rothgerber Christie LLP

(57) ABSTRACT

An electronic device in some embodiments includes: a display layer configured to display an image based on image data and having a plurality of regions defined thereon; a sensor layer on the display layer; and a sensor driver configured to receive image information data calculated based on the image data, to generate an output signal based on the image information data, and to provide the output signal to the sensor layer, wherein the image information data includes noise information on the image, the noise information being calculated based on the plurality of regions. Some embodiments may include the electronic device included in an interface device.

20 Claims, 19 Drawing Sheets

(51) Int. Cl.
  *G06F 3/0354* (2013.01)
  *G09G 3/32* (2016.01)
  *H01L 27/32* (2006.01)
  *G06F 3/044* (2006.01)

(52) U.S. Cl.
  CPC ..... *G09G 2340/14* (2013.01); *G09G 2354/00* (2013.01); *G09G 2360/16* (2013.01)

(56) References Cited

U.S. PATENT DOCUMENTS

| | | | |
|---|---|---|---|
| 2015/0363012 A1* | 12/2015 | Sundara-Rajan | G06F 3/0441 345/179 |
| 2020/0257429 A1* | 8/2020 | Hisano | G06F 3/04184 |
| 2022/0137782 A1* | 5/2022 | Seger, Jr. | G06F 3/0412 345/156 |

* cited by examiner

FIG. 11A

| k | k | k | k | ... | k | k | — AR1
| k | k | k | k | ... | k | k | — AR2
| k | k | k | k | ... | k | k | — AR3
| ⋮ | ⋮ | ⋮ | ⋮ | ⋮ | ⋮ | ⋮ |
| k | k | k | k | ... | k | k | — ARn−1
| k | k | k | k | ... | k | k | — ARn

FIG. 11B

| 255 | 255 | 255 | 255 | ... | 255 | 255 | — AR1
| 0 | 0 | 0 | 0 | ... | 0 | 0 | — AR2
| 255 | 255 | 255 | 255 | ... | 255 | 255 | — AR3
| ⋮ | ⋮ | ⋮ | ⋮ | ⋮ | ⋮ | ⋮ |
| 255 | 255 | 255 | 255 | ... | 255 | 255 | — ARn−1
| 0 | 0 | 0 | 0 | ... | 0 | 0 | — ARn

ELECTRONIC DEVICE AND INTERFACE DEVICE INCLUDING THE SAME

CROSS-REFERENCE TO RELATED APPLICATION

The present application claims priority to and the benefit of Korean Patent Application No. 10-2020-0101182, filed on Aug. 12, 2020, the entire content of which is hereby incorporated by reference.

BACKGROUND

Aspects of some example embodiments of the present disclosure herein relate to an electronic device with relatively improved sensing performance and an interface device including the same.

Multimedia electronic devices such as televisions, mobile phones, tablet computers, navigation system units, and game consoles are equipped with an electronic device for displaying images. The electronic devices may include an input sensor that may provide a touch-based input method which allows a user to easily input information or commands intuitively and conveniently in addition to a conventional input method such as a button, a keyboard, and a mouse.

The input sensor may sense a touch or pressure by a user's body. Meanwhile, the demand for using an active pen for a fine touch input for a user who is familiar with inputting information using a writing instrument or a specific application program (for example, an application program for sketches or drawings) is increasing.

The above information disclosed in this Background section is only for enhancement of understanding of the background and therefore the information discussed in this Background section does not necessarily constitute prior art.

SUMMARY

Aspects of some example embodiments of the present disclosure include an electronic device with relatively improved sensing performance and an interface device including an input device and an electronic device configured to sense an input by the input device.

Aspects of some embodiments of the inventive concept include an electronic device including a display layer configured to display an image based on image data and having a plurality of regions defined thereon, a sensor layer disposed on the display layer, and a sensor driver configured to receive image information data calculated on the basis of the image data, generate an output signal based on the image information data, and provide the output signal to the sensor layer, wherein the image information data includes noise information on the image, and the noise information may be calculated on the basis of the plurality of regions.

According to some embodiments, the image information data may be determined on the basis of a standard deviation of differences derived by a plurality of average gray levels, wherein each of the plurality of average gray levels may be an average value of gray levels displayed in a corresponding region among the plurality of regions, and each of the differences may be a difference between the average gray level of one region among the plurality of regions and the average gray level of another region adjacent to the one region.

According to some embodiments, the display layer may include a plurality of pixels arranged in a first direction and a direction intersecting the first direction, wherein each of the plurality of pixels includes a first sub-pixel, a second sub-pixel, and a third sub-pixel providing different colors, each of the plurality of average gray levels may include a first sub-average gray level corresponding to the first sub-pixel, a second sub-average gray level corresponding to the second sub-pixel, and a third sub-average gray level corresponding to the third sub-pixel, the standard deviation may include a first sub-standard deviation calculated on the basis of the first sub-average gray level, a second sub-standard deviation calculated on the basis of the second sub-average gray level, and a third sub-standard deviation calculated on the basis of the third sub-average gray level, wherein the image information data may be determined on the basis of the maximum standard deviation of the first sub-standard deviation, the second sub-standard deviation, and the third sub-standard deviation.

According to some embodiments, the display layer may include a plurality of pixels arranged in a first direction and a direction intersecting the first direction, and each of the plurality of regions may include a row of pixels arranged along the first direction among the plurality of pixels.

According to some embodiments, the electronic device may further include a display driver electrically connected to the display layer and configured to control the display layer, wherein the image information data is provided from the display driver to the sensor driver.

According to some embodiments, the electronic device may further include a display driver electrically connected to the display layer and configured to control the display layer and a main controller configured to control the display driver and the sensor driver, wherein the image information data may be provided from the main controller to the sensor driver.

According to some embodiments, the sensor driver may operate in a first mode for sensing an input by an input device which outputs a down-link signal or in a second mode for sensing an input by a touch.

According to some embodiments, the first mode may include an up-link section in which the sensor driver outputs an up-link signal to the sensor layer and a down-link section in which the sensor driver receives the down-link signal through the sensor layer, wherein the up-link signal may include the image information data and the intensity of the down-link signal may be changed in correspondence to the image information data.

According to some embodiments, an input region in which a user interface for inducing an input by the input device is displayed may be defined on the display layer, wherein the plurality of regions may be defined in the input region.

According to some embodiments, the noise information included in the image information data may be information on an image of one frame to be displayed in the input region.

According to some embodiments, the sensor driver may change the frequency of the output signal on the basis of the image information data.

According to some embodiments, the output signal whose frequency has been changed may be provided to the sensor layer in the second mode.

According to some embodiments, the sensor driver may change the operation time of each of the first mode and the second mode on the basis of the image information data.

According to some embodiments of the inventive concept, an interface device includes an electronic device including a display layer configured to display an image based on image data, a sensor layer on the display layer, a display driver configured to drive the display layer, a sensor driver configured to drive the sensor layer, and a main controller configured to control the display driver and the sensor driver, and an input device configured to receive an up-link signal from the sensor layer and output a down-link signal to the sensor layer, wherein the sensor driver may operate in a first mode for sensing an input by the input device or in a second mode for sensing an input by a touch, the sensor driver may receive image information data calculated on the basis of the image data, and the sensor driver may generate an output signal provided to the sensor layer on the basis of the image information data.

According to some embodiments, in the first mode, the output signal may be the up-link signal, and the sensor driver may output the up-link signal including the image information data to the sensor layer.

According to some embodiments, the input device may receive the up-link signal, and may output the down-link signal whose intensity has been adjusted.

According to some embodiments, in the second mode, the sensor driver may change the frequency of the output signal on the basis of the image information data, and the sensor driver may output the output signal whose frequency has been changed to the sensor layer.

According to some embodiments, the image information data may be provided from the display driver to the sensor driver.

According to some embodiments, the image information data may be provided from the main controller to the sensor driver.

According to some embodiments, the display layer may be defined to have a plurality of regions, the image information data may include noise information on the image, and the noise information may be calculated on the basis of the plurality of regions.

BRIEF DESCRIPTION OF THE FIGURES

The accompanying drawings are included to provide a further understanding of the inventive concept, and are incorporated in and constitute a part of this specification. The drawings illustrate aspects of some example embodiments of the inventive concept and, together with the description, serve to explain principles of embodiments according to the inventive concept. In the drawings:

FIG. 11A is a view displaying the gray level of each pixel;

FIG. 11B is a view displaying the gray level of each pixel;

DETAILED DESCRIPTION

Figure 1:
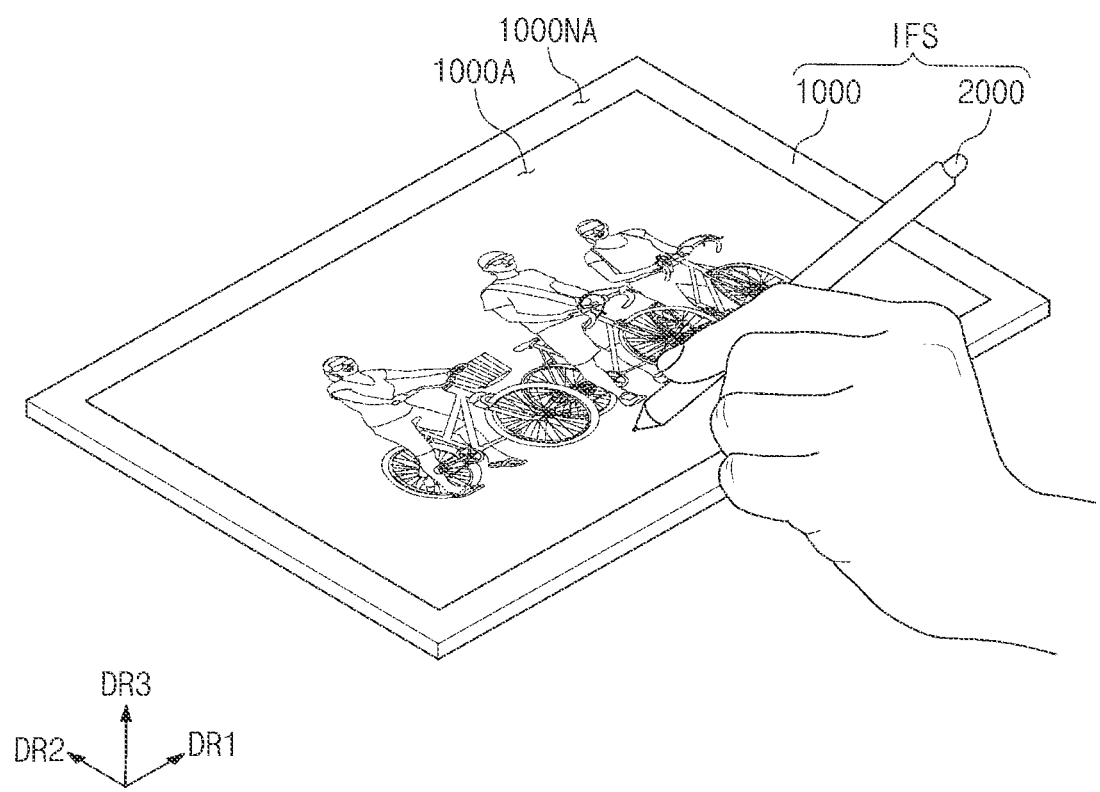
FIG. 1 is a perspective view of an interface device according to some embodiments of the inventive concept.

In the present disclosure, when an element (or a region, a layer, a portion, etc.) is referred to as being "on," "connected to," or "coupled to" another element, it means that the element may be directly located on/connected to/coupled to the other element, or that a third element may be located therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by those skilled in the art to which the inventive concept pertains. It is also to be understood that terms defined in commonly used dictionaries should be interpreted as having meanings consistent with the dictionary definitions in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

The term "part" or "unit" means a software component or a hardware component that performs a particular function. The hardware component may include, for example, a field-programmable gate array (FPGA) or an application-specific integrated circuit (ASIC). The software component may refer to an executable code and/or data used by an executable code in an addressable storage medium. Therefore, software components may be, for example, object-oriented software components, class components, and work components, and may include processes, functions, attributes, procedures, subroutines, program code segments, drivers, firmware, micro codes, circuits, data, databases, data structures, tables, arrangements, or variables.

Hereinafter, aspects of some example embodiments of the inventive concept will be described in more detail with reference to the accompanying drawings.

FIG. 1 is a perspective view of an interface device according to some embodiments of the inventive concept.

Referring to FIG. 1, an interface device IFS may include an electronic device 1000 and an input device 2000, which may be external or separate with respect to the electronic device 1000, such that the input device 2000 is configured to provide input signals to the electronic device 1000 as described in more detail below. The electronic device 1000 may sense an input by the input device 2000. In the present disclosure, the electronic device 1000 and the input device 2000 are referred to as the interface device IFS. The interface device IFS may be referred to as an electronic system, a touch system, an input/output system, a pen tablet, or a pen terminal.

The electronic device 1000 may be a device activated by an electrical signal. For example, the electronic device 1000 may be a mobile phone, a foldable mobile phone, a tablet computer, a car navigation system, a game console, or a wearable device, but embodiments according to the inventive concept are not limited thereto. In FIG. 1, the electronic device 1000 is illustrated, for example, as a tablet computer.

In the electronic device 1000, an active region 1000A and a peripheral region 1000NA may be defined. The electronic device 1000 may display images at the active region 1000A. The active region 1000A may include a plane defined by a first direction DR1 and a second direction DR2. The peripheral region 1000NA may surround the active region 1000A. That is, the peripheral region 1000NA may be a bezel area that is in a periphery of (or outside a footprint of) the active region 1000A.

The thickness direction of the electronic device 1000 may be parallel to a third direction DR3 intersecting the first direction DR1 and the second direction DR2 in a plan view or a direction perpendicular or normal with respect to a plane defined by the first direction DR1 and the second direction DR2. Therefore, a front surface (or an upper surface) and a rear surface (or a lower surface) of members constituting the electronic device 1000 may be defined on the basis of the third direction DR3.

Figure 2:
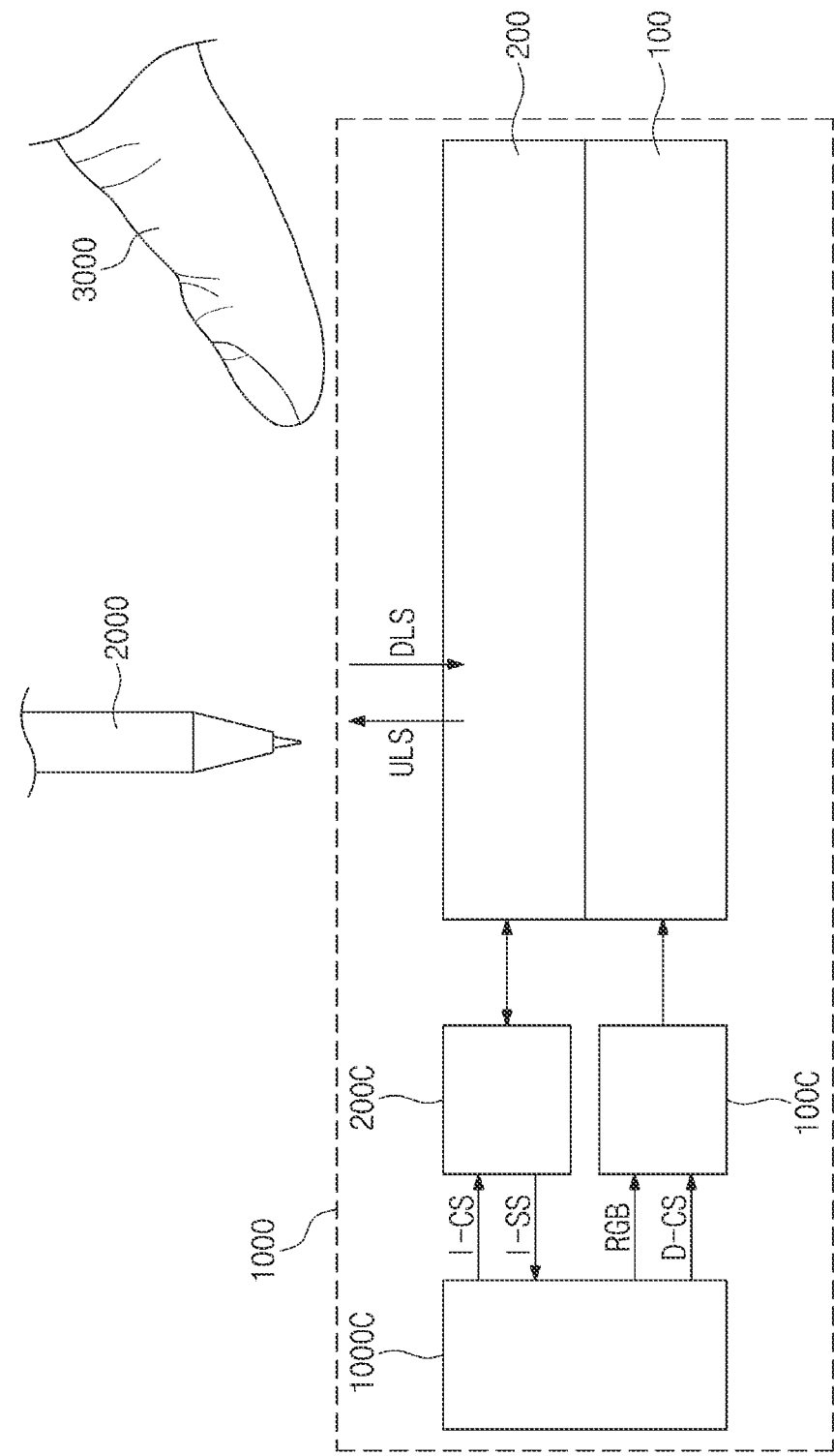
FIG. 2 is a view for describing an operation between an electronic device and an input device according to some embodiments of the inventive concept.

FIG. 2 is a view for describing an operation between an electronic device and an input device according to some embodiments of the inventive concept.

Referring to FIG. 2, the electronic device 1000 may sense inputs applied from the outside (e.g., from the input device 2000, or other external objects such as the user's finger, a passive stylus, etc.). For example, the electronic device 1000 may sense both a first input by the input device 2000 and a second input by a touch 3000. The input device 2000 is an active-type input means providing a driving signal, and may be, for example, an active pen. The touch 3000 may include all of input means capable of bringing a change in capacitance, such as a user's body and a passive pen.

The electronic device 1000 and the input device 2000 may communicate in a bidirectional manner. The electronic device 1000 may provide an up-link signal ULS to the input device 2000, and the input device 2000 may provide a down-link signal DLS to the electronic device 1000. For example, the up-link signal ULS may include information such as panel information, a protocol version, and the like, but the embodiments of the inventive concept are not particularly limited thereto. The down-link signal DLS may include a synchronization signal or information on the state of the input device 2000. For example, the down-link signal DLS may include coordinate information of the input device 2000, battery information of the input device 2000, slope information of the input device 2000, and/or various information stored in the input device 2000, but the embodiments of the inventive concept are not particularly limited thereto.

The electronic device 1000 may include a display layer 100, a sensor layer 200, a display driver 100C, a sensor driver 200C, and a main driver 1000C.

The display layer 100 may be a component for substantially generating an image. The display layer 100 may be a light-emitting type display layer. For example, the display layer 100 may be an organic light emitting display layer, a quantum-dot display layer, a micro-LED display layer, or a nano-LED display layer.

The sensor layer 200 may be located on the display layer 100. The sensor layer 200 may sense an external input applied from the outside. The sensor layer 200 may sense both the first input by the input device 2000 and the second input by the touch 3000.

The main driver 1000C may control the overall operation of the electronic device 1000. For example, the main driver 1000C may control the operation of the display driver 100C and the sensor driver 200C. The main driver 1000C may include at least one micro-processor, and the main driver 1000C may be referred to as a host.

The display driver 100C may drive the display layer 100. The main driver 1000C may further include a graphics controller. The display driver 100C may receive an image data RGB and a control signal D-CS from the main driver 1000C. The control signal D-CS may include various signals. For example, the control signal D-CS may include an input vertical synchronization signal, an input horizontal synchronization signal, a main clock signal, a data enable signal, and the like. The display driver 100C may generate a vertical synchronization signal and a horizontal synchronization signal to control the timing of providing a signal to the display layer 100 on the basis of the control signal D-CS.

The sensor driver 200C may drive the sensor layer 200. The sensor driver 200C may receive a control signal I-CS from the main driver 1000C. The control signal I-CS may include a mode determination signal and a clock signal for determining the driving mode of the sensor driver 200C. The sensor driver 200C may operate in a first mode for sensing the first input by the input device 2000 or in a second mode for sensing the second input by the touch 3000 on the basis of the control signal I-CS. The sensor driver 200C may operate in the first mode or in the second mode to be described later with reference to FIG. 7A, FIG. 7B, and FIG. 8, on the basis of the mode determination signal.

The sensor driver 200C may calculate coordinate information of the first input or the second input on the basis of a signal received from the sensor layer 200, and may provide a coordinate signal I-SS having the coordinate information to the main driver 1000C. The main driver 1000C execute an operation corresponding to a user input on the basis of the coordinate signal I-SS. For example, the main driver 1000C may operate the display driver 100C such that a new application image may be displayed on the display layer 100.

Figure 3A:
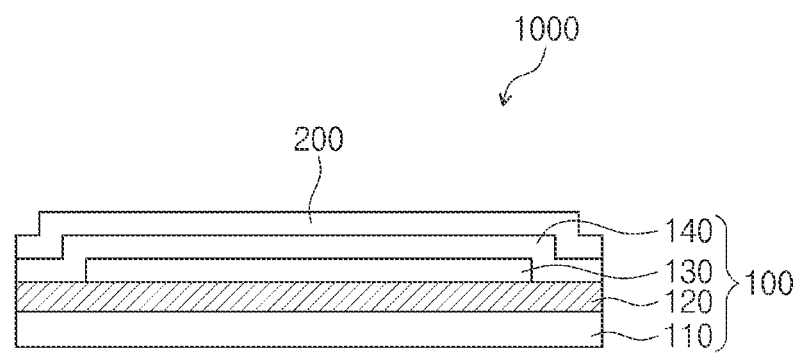
FIG. 3A is a cross-sectional view of an electronic device according to some embodiments of the inventive concept.
Figure 3A:
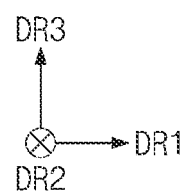

FIG. 3A is a cross-sectional view of an electronic device according to some embodiments of the inventive concept.

Referring to FIG. 3A, the display layer 100 may include a base layer 110, a circuit layer 120, a light emitting element layer 130, and an encapsulation layer 140.

The base layer 110 may be a member which provides a base surface on which the circuit layer 120 is located. The base layer 110 may be a glass substrate, a metal substrate, or a polymer substrate. However, the embodiments of the inventive concept are not limited thereto, and the base layer 110 may be an inorganic layer, an organic layer, or a composite material layer.

The base layer 110 may have a multi-layered structure. For example, the base layer 110 may include a first synthetic resin layer, a silicon oxide (SiOx) layer located on the first synthetic resin layer, an amorphous silicon (a-Si) layer located on the silicon oxide layer, and a second synthetic resin layer located on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, in the present disclosure, "~~"-based resin means that a functional group of "~~" is included.

The circuit layer 120 may be located on the base layer 110. The circuit layer 120 may include an insulation layer, a semiconductor pattern, a conductive pattern, a signal line, and the like. The insulation layer, a semiconductor layer, and a conductive layer are formed on the base layer 110 by coating, deposition, and the like, and thereafter, the insulation layer, the semiconductor layer, and the conductive layer may be selectively patterned through performing a photolithography process a plurality of times. Thereafter, the insulation layer, the semiconductor pattern, the conductive pattern, and the signal line, all included in the circuit layer 120, may be formed.

The light emitting element layer 130 may be located on the circuit layer 120. The light emitting element layer 130 may include a light emitting element. For example, the light emitting element layer 130 may include an organic light emitting material, a quantum dot, a quantum rod, a micro LED, or a nano LED.

The encapsulation layer 140 may be located on the light emitting element layer 130. The encapsulation layer 140 may protect the light emitting element layer 130 from foreign materials such as moisture, oxygen, and dust particles.

The sensor layer 200 may be located on the display layer 100. The sensor layer 200 may sense an external input applied from the outside. The external input may be a user input. The user input includes various forms of external inputs such as a part of a user's body, light, heat, a pen, and pressure.

The sensor layer 200 may be formed on the display layer 100 through a series of processes. In this case, the sensor layer 200 may be expressed as being directly located on the display layer 100. Being directly located may mean that a third component is not located between the sensor layer 200 and the display layer 100. That is, a separate adhesive member may not be located between the sensor layer 200 and the display layer 100.

Alternatively, the sensor layer 200 and the display layer 100 may be coupled to each other by an adhesive member. The adhesive member may include a typical adhesive or a pressure-sensitive adhesive.

According to some embodiments, the electronic device 1000 may further include an anti-reflection layer and an optical layer located on the sensor layer 200. The anti-reflection layer may reduce the reflectance of external light incident from the outside of the electronic device 1000. The optical layer may improve the front surface luminance of the electronic device 1000 by controlling the direction of light incident from the display layer 100.

Figure 3B:
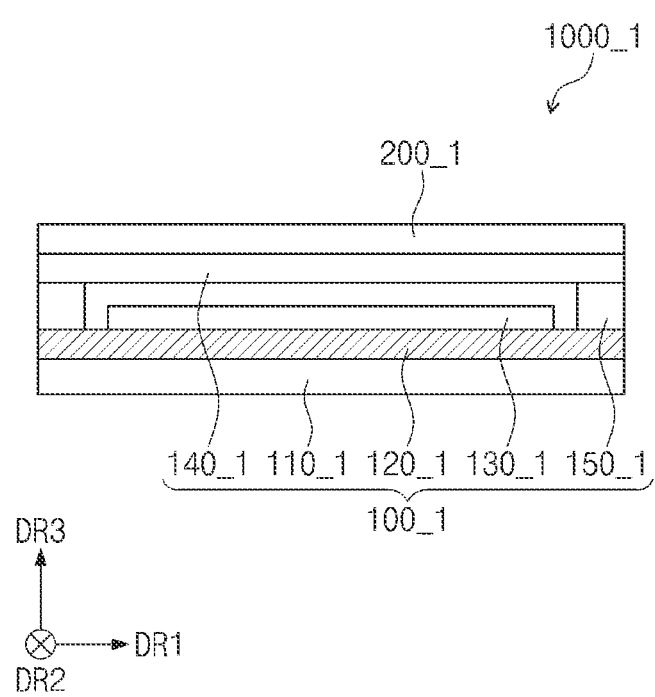
FIG. 3B is a cross-sectional view of an electronic device according to some embodiments of the inventive concept.
Figure 3B:
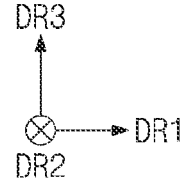

FIG. 3B is a cross-sectional view of an electronic device according to some embodiments of the inventive concept.

Referring to FIG. 3B, an electronic device 1000_1 may include a display layer 100_1 and a sensor layer 200_1. The display layer 100_1 may include a base substrate 110_1, a circuit layer 120_1, a light emitting element layer 130_1, an encapsulation substrate 140_1, and a coupling member 150_1.

Each of the base substrate 110_1 and the encapsulation substrate 140_1 may be a glass substrate, a metal substrate, a polymer substrate, or the like, but the embodiments of the inventive concept are not particularly limited thereto.

The coupling member 150_1 may be located between the base substrate 110_1 and the encapsulation substrate 140_1. The coupling member 150_1 may couple the encapsulation substrate 140_1 to the base substrate 110_1 or to the circuit layer 120_1. The coupling member 150_1 may include an inorganic material or an organic material. For example, the inorganic material may include frit seal, and the organic material may include a photo-curable resin or a photo-plastic resin. However, the material constituting the coupling member 150_1 is not limited to the above examples.

The sensor layer 200_1 may be directly located on the encapsulation substrate 140_1. Being directly located may mean that a third component is not located between the sensor layer 200_1 and the encapsulation substrate 140_1. That is, a separate coupling member may not be located between the sensor layer 200_1 and the display layer 100_1. However, the embodiments of the inventive concept are not limited thereto. An adhesive layer may be further located between the sensor layer 200_1 and the encapsulation substrate 140_1.

Figure 4:
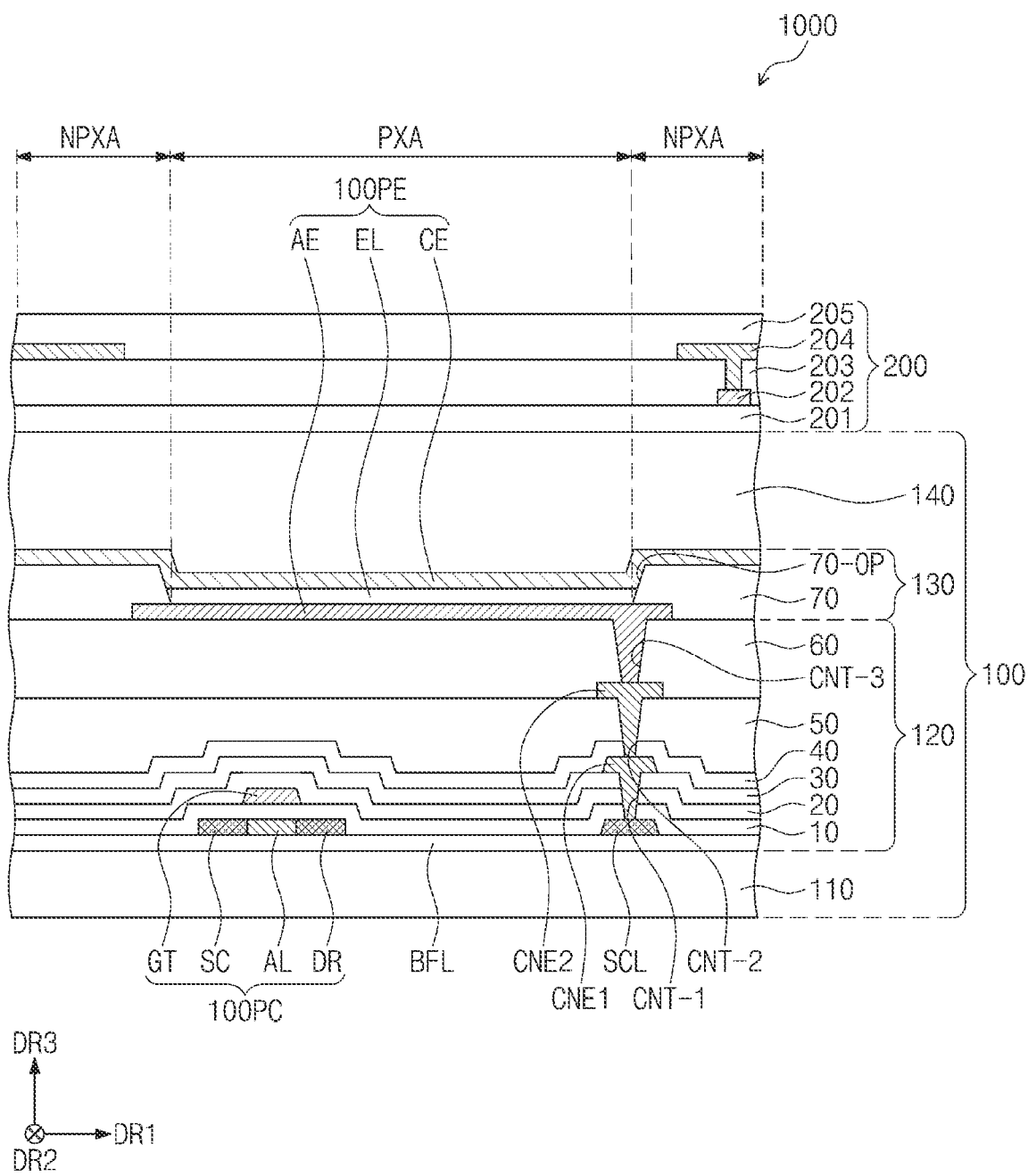
FIG. 4 is a cross-sectional view of an electronic device according to some embodiments of the inventive concept.

FIG. 4 is a cross-sectional view of an electronic device according to some embodiments of the inventive concept.

Referring to FIG. 4, at least one inorganic layer is formed on an upper surface of the base layer 110. The inorganic layer may include at least one of aluminum oxide, titanium oxide, silicon oxide, silicon nitride, silicon oxynitride, zirconium oxide, or hafnium oxide. The inorganic layer may be formed as a multi-layered inorganic layer. The multi-layered inorganic layers may constitute the barrier layer and/or the buffer layer. In FIG. 4, the display layer 100 is illustrated as including a buffer layer BFL.

The buffer layer BFL may improve the bonding force between the base layer 110 and the semiconductor pattern. The buffer layer BFL may include at least one of silicon oxide, silicon nitride, or silicon oxynitride. For example, the buffer layer BFL may include a structure in which a silicon oxide layer and a silicon nitride layer are alternately stacked.

The semiconductor pattern may be located on the buffer layer BFL. The semiconductor pattern may include polysilicon. However, the embodiments of the inventive concept are not limited thereto. The semiconductor pattern may include amorphous silicon, low-temperature polycrystalline silicon, or an oxide semiconductor.

FIG. 4 only illustrates a portion of the semiconductor pattern, and the semiconductor pattern may be further located in another region. The semiconductor pattern may be arranged according to a specific rule across pixels. The semiconductor pattern may have different electrical properties depending on whether or not the semiconductor pattern is doped. The semiconductor pattern may include a first region having a high conductivity rate and a second region having a low conductivity rate. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region or a region doped to a lower concentration than the first region.

The conductivity of the first region may be greater than the conductivity of the second region, and the first region may substantially serve as an electrode or a signal line. The second region may substantially correspond to an active (or a channel) of a transistor. In other words, a portion of the semiconductor pattern may be an active of the transistor, another portion thereof may be a source or a drain of the transistor, and the other portion thereof may be a connection electrode or a connection signal line.

Each of the pixels may have an equivalent circuit including seven transistors, one capacitor, and a light emitting element, and the equivalent circuit diagram of a pixel may be modified in various forms. FIG. 4 illustrates, for example, one transistor 100PC and a light emitting element 100PE included in a pixel.

A source SC, an active AL, and a drain DR of the transistor 100PC may be formed from the semiconductor pattern. The source SC and the drain DR may extend in opposite directions from the active AL on a cross section. FIG. 4 illustrates a portion of a connection signal line SCL formed from the semiconductor pattern. According to some embodiments, the connection signal line SCL may be connected to the drain DR of the transistor 100PC on a plane.

A first insulation layer 10 may be located on the buffer layer BFL. The first insulation layer 10 commonly overlaps a plurality of pixels, and may cover the semiconductor pattern. The first insulation layer 10 may be an inorganic layer and/or an organic layer, and may have a single-layered structure or a multi-layered structure. The first insulation layer 10 may include at least one of aluminum oxide, titanium oxide, silicon oxide, silicon nitride, silicon oxynitride, zirconium oxide, or hafnium oxide. According to some embodiments, the first insulation layer 10 may be a silicon oxide layer of a single layer. Not only the first insulation layer 10 but also an insulation layer of the circuit layer 120 to be described later may be an inorganic layer and/or an organic layer, and may have a single-layered structure or a multi-layered structure. The inorganic layer may include at least one of the above-described materials, but the embodiments of the inventive concept are not limited thereto.

A gate GT of the transistor 100PC is located on the first insulation layer 10. The gate GT may be a portion of a metal pattern. The gate GT overlaps the active AL. In a process of doping the semiconductor pattern, the gate GT may function as a mask.

A second insulation layer 20 is located on the first insulation layer 10, and may cover the gate GT. The second insulation layer 20 may commonly overlap pixels. The second insulation layer 20 may be an inorganic layer and/or an organic layer, and may have a single-layered structure or a multi-layered structure. The second insulation layer 20 may include at least one of silicon oxide, silicon nitride, or silicon oxynitride. According to some embodiments, the second insulation layer 20 may have a multi-layered structure including a silicon oxide layer and a silicon nitride layer.

A third insulation layer 30 may be located on the second insulation layer 20. The third insulation layer 30 may have a single-layered structure or a multi-layered structure. For example, the third insulation layer 30 may have a multi-layered structure including a silicon oxide layer and a silicon nitride layer.

A first connection electrode CNE1 may be located on the third insulation layer 30. The first connection electrode CNE1 may be connected to the connection signal line SCL through a contact hole CNT-1 passing through the first to third insulation layers 10, 20, and 30.

A fourth insulation layer 40 may be located on the third insulation layer 30. The fourth insulation layer 40 may be a silicon oxide layer of a single layer. A fifth insulation layer 50 may be located on the fourth insulation layer 40. The fifth insulation layer 50 may be an organic layer.

A second connection electrode CNE2 may be located on the fifth insulation layer 50. The second connection electrode CNE2 may be connected to the first connection electrode CNE1 through a contact hole CNT-2 passing through the fourth insulation layer 40 and the fifth insulation layer 50.

A sixth insulation layer 60 is located on the fifth insulation layer 50, and may cover the second connection electrode CNE2. The sixth insulation layer 60 may be an organic layer.

The light emitting element layer 130 may be located on the circuit layer 120. The light emitting element layer 130 may include the light emitting element 100PE. For example, the light emitting element layer 130 may include an organic light emitting material, a quantum dot, a quantum rod, a micro LED, or a nano LED. Hereinafter, the light emitting element 100PE is described, for example, as being an organic light emitting element, but the embodiments of the inventive concept are not particularly limited thereto.

The light emitting element 100PE may include a first electrode AE, a light emitting layer EL, and a second electrode CE.

The first electrode AE may be located on the sixth insulation layer 60. The first electrode AE may be connected to the second connection electrode CNE2 through a contact hole CNT-3 passing through the sixth insulation layer 60.

A pixel definition film 70 is located on the sixth insulation layer 60, and may cover a portion of the first electrode AE. In the pixel definition film 70, an opening 70-OP is defined. The opening 70-OP of the pixel definition film 70 exposes at least a portion of the first electrode AE.

The active region 1000A (see FIG. 1) may include a light emitting area PXA, and a non-light emitting area NPXA adjacent to the light emitting area PXA. The non-light emitting region NPXA may surround the light emitting region PXA. According to some embodiments, a light emitting region PXA is defined to correspond to some regions of the first electrode AE exposed by the opening 70-OP.

The light emitting layer EL may be located on the first electrode AE. The light emitting layer EL may be located in a region corresponding to the opening 70-OP. That is, the light emitting layer EL may be divided and formed in each of the pixels. When the light emitting layer EL is divided and formed in each of the pixels, each of the light emitting layers EL may emit light of at least one color of blue, red, or green. However, the embodiments of the inventive concept are not limited thereto, and the light emitting layer EL may be commonly provided in the pixels. In this case, the light emitting layer EL may provide blue light or white light.

The second electrode CE may be located on the light emitting layer EL. The second electrode CE has an integral shape, and may be commonly formed in the plurality of pixels.

According to some embodiments, a hole control layer may be located between the first electrode AE and the light emitting layer EL. The hole control layer may be commonly formed in the light emitting region PXA and the non-light emitting region NPXA. The hole control layer includes a hole transport layer, and may further include a hole injection layer. An electron control layer may be located between the light emitting layer EL and the second electrode CE. The electron control layer includes an electron transport layer, and may further include an electron injection layer. The hole control layer and the electron control layer may be commonly formed in the plurality of pixels using an open mask.

The encapsulation layer 140 may be located on the light emitting element layer 130. The encapsulation layer 140 may include an inorganic layer, an organic layer, and an inorganic layer sequentially stacked, but layers constituting the encapsulation layer 140 are not limited thereto.

The inorganic layers may protect the light emitting element layer 130 from moisture and oxygen, and the organic layer may protect the light emitting element layer 130 from foreign materials such as dust particles. The inorganic layers may include a silicon nitride layer, a silicon oxynitride layer, a silicon oxide layer, a titanium oxide layer, an aluminum oxide layer, or the like. The organic layer may include an acrylic organic layer, but the embodiments of the inventive concept are not limited thereto.

The sensor layer 200 may include a base layer 201, a first conductive layer 202, a sensing insulation layer 203, a second conductive layer 204, and a cover insulation layer 205.

The base layer 201 may be an inorganic layer including at least one of silicon nitride, silicon oxynitride, or silicon oxide. Alternatively, the base layer 201 may be an organic layer including an epoxy resin, an acrylic resin, or an imide-based resin. The base layer 201 may have a single-layered structure, or a multi-layered structure in which layers are stacked along the third direction DR3.

Each of the first conductive layer 202 and the second conductive layer 204 may have a single-layered structure, or a multi-layered structure in which layers are stacked along the third direction DR3.

A conductive layer of a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layer may include a conductive polymer such as PEDOT, a metal nanowire, graphene, and the like.

A conductive layer of a multi-layered structure may include metal layers. The metal layers may have, for example, a three-layered structure of titanium/aluminum/titanium. The conductive layer of a multi-layered structure may include at least one metal layer and at least one transparent conductive layer.

At least one of the sensing insulation layer 203 and the cover insulation layer 205 may include an inorganic film. The inorganic film may include at least one of aluminum oxide, titanium oxide, silicon oxide, silicon nitride, silicon oxynitride, zirconium oxide, or hafnium oxide.

At least one of the sensing insulation layer 203 and the cover insulation layer 205 may include an organic film. The organic film may include at least any one among an acrylic resin, a methacryl-based resin, polyisoprene, a vinyl-based resin, an epoxy-based resin, a urethane-based resin, a cellulose-based resin, a siloxane-based resin, a polyimide-based resin, a polyimide-based resin, or a perylene-based resin.

Figure 5:
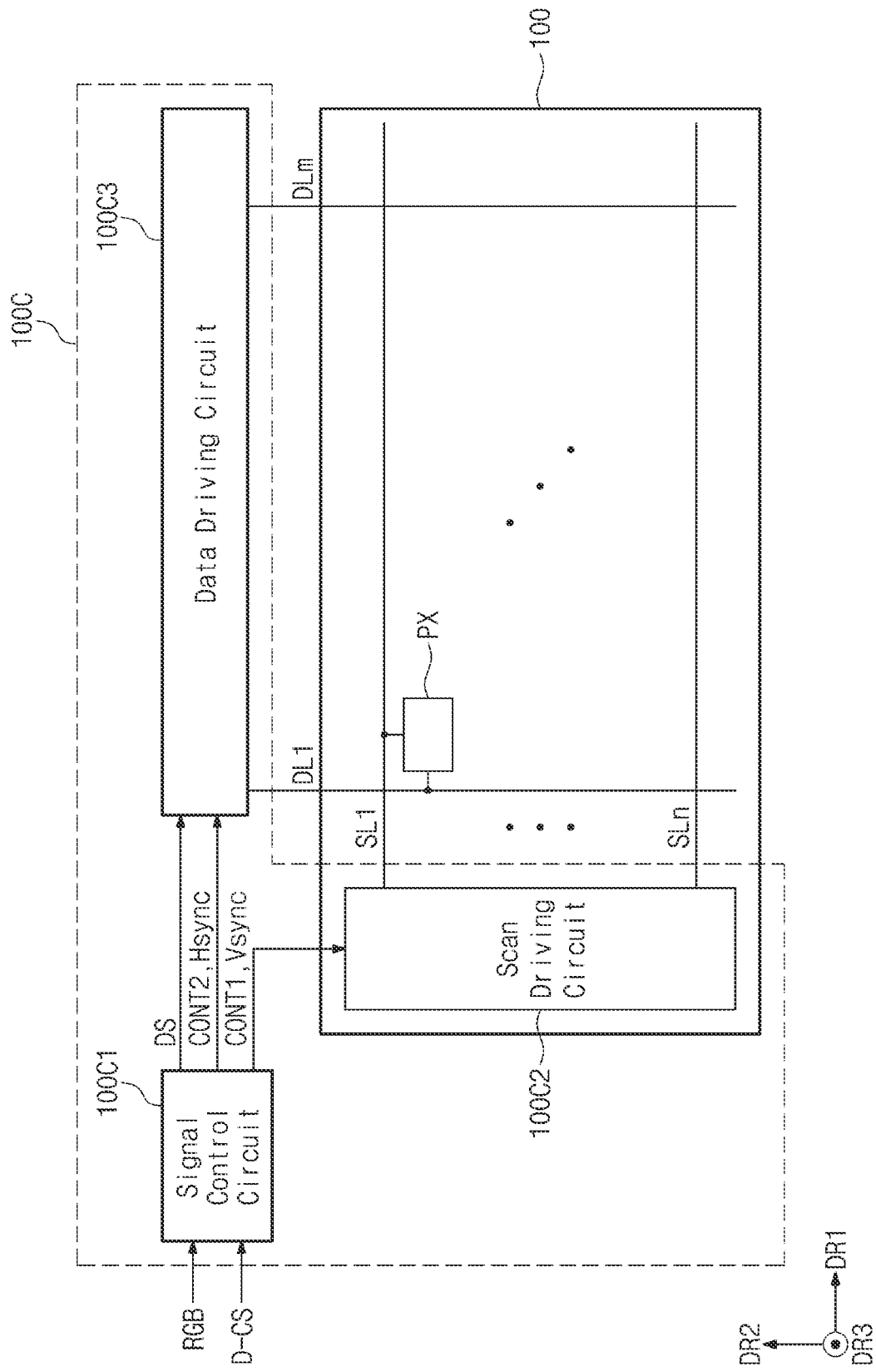
FIG. 5 is a block diagram of a display driver according to some embodiments of the inventive concept.

FIG. 5 is a block diagram of a display driver according to some embodiments of the inventive concept.

Referring to FIG. 5, the display layer 100 may include a plurality of scan lines SI1 to SLn, a plurality of data lines DL1 to DLm, and a plurality of pixels PX. Each of the plurality of pixels PX is connected to a corresponding data line among the plurality of data lines DL1 to DLm and connected to a corresponding scan line among the plurality of scan lines SL1 to SLn. According to some embodiments of the inventive concept, the display layer 100 may further include light emitting control lines, and the display driver 100C may further include a light emitting driving circuit configured to provide control signals to the light emitting control lines. The configuration of the display layer 100 is not particularly limited.

The display driver 100C may include a signal control circuit 100C1, a scan driving circuit 100C2, and a data driving circuit 100C3.

The signal control circuit 100C1 may receive the image data RGB and the control signal D-CS from the main driver 1000C (see FIG. 2). The control signal D-CS may include various signals. For example, the control signal D-CS may include an input vertical synchronization signal, an input horizontal synchronization signal, a main clock signal, a data enable signal, and the like.

The signal control circuit 100C1 may generate a first control signal CONT1 and a vertical synchronization signal Vsync on the basis of the control signal D-CS, and may output the first control signal CONT1 and the vertical synchronization signal Vsync to the scan driving circuit 100C2. The vertical synchronization signal Vsync may be included in the first control signal CONT1.

The signal control circuit 100C1 may generate a second control signal CONT2 and a horizontal synchronization signal Hsync on the basis of the control signal D-CS, and may output the second control signal CONT2 and the horizontal synchronization signal Hsync to the data driving circuit 100C3. The horizontal synchronization signal Hsync may be included in the second control signal CONT2.

In addition, the signal control circuit 100C1 may output a data signal DS obtained by processing the image data RGB according to operation conditions of the display layer 100 to the data driving circuit 100C3. The first control signal CONT1 and the second control signal CONT2 are signals required for the operation of the scan driving circuit 100C2 and the data driving circuit 100C3, and are not particularly limited.

The scan driving circuit 100C2 drives the plurality of scan lines SL1 to SLn in response to the first control signal CONT1 and the vertical synchronization signal Vsync. According to some embodiments of the inventive concept, the scan driving circuit 100C2 may be formed in the same process as that of the circuit layer 120 (see FIG. 4) in the display layer 100, but the embodiments of the inventive concept are not limited thereto. For example, the scan driving circuit 100C2 may be implemented as an integrated circuit (IC) and mounted directly on a region (e.g., a set or predetermined region) of the display layer 100, or mounted on a separate printed circuit board in a chip on film (COF) manner to be electrically connected to the display layer 100.

The data driving circuit 100C3 may output gray scale voltages for driving the plurality of the data lines DL1 to DLm in response to the second control signal CONT2, the horizontal synchronization signal Hsync, and the data signal DS from the signal control circuit 100C1. The data driving circuit 100C3 may be implemented as an integrated circuit and mounted directly on a region (e.g., a set or predetermined region) of the display layer 100, or mounted on a separate printed circuit board in a chip on film manner to be electrically connected to the display layer 100. However, the embodiments of the inventive concept are not particularly limited. For example, the data driving circuit 100C3 may be formed in the same process as that of the circuit layer 120 (see FIG. 4) in the display layer 100.

Figure 6:
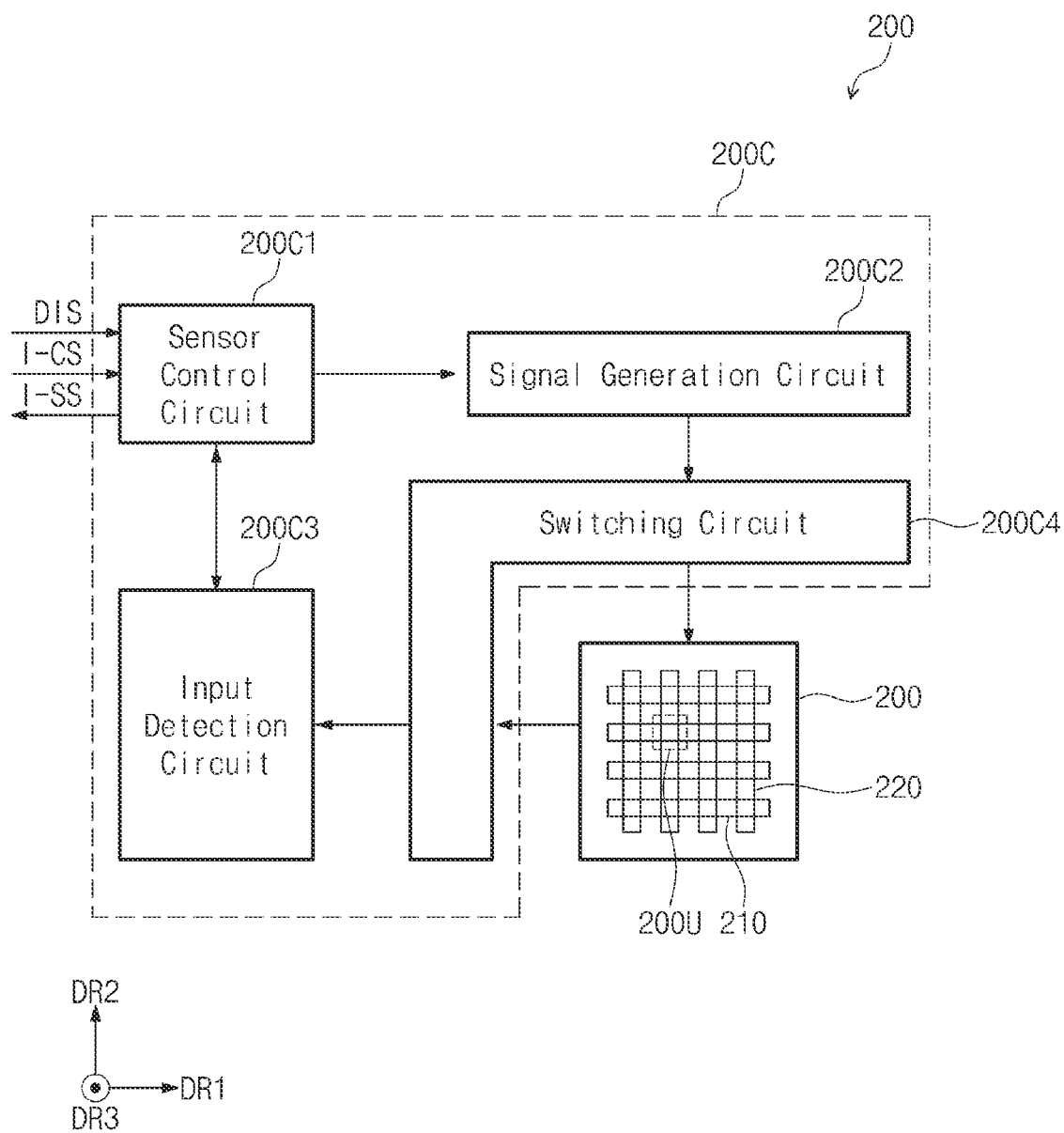
FIG. 6 is a block diagram of a sensor layer and a sensor driver according to some embodiments of the inventive concept.

FIG. 6 is a block diagram of a sensor layer and a sensor driver according to some embodiments of the inventive concept.

Referring to FIG. 6, the sensor layer 200 may include a plurality of electrodes 210 and a plurality of cross electrodes 220. The plurality of cross electrodes 220 may cross the plurality of electrodes 210. According to some embodiments, the sensor layer 200 may further include a plurality of signal lines connected to the plurality of electrodes 210 and the plurality of cross electrodes 220. Each of the plurality of electrodes 210 and the plurality of cross electrodes 220 may have a bar shape or a stripe shape. The plurality of electrodes 210 and the plurality of cross electrodes 220 of such a shape may improve the sensing properties of consecutive linear inputs. However, the shape of the plurality of electrodes 210 and the plurality of cross electrodes 220 is not limited thereto. That is, the electrodes 210 and the cross electrodes 220 may have any suitable shape according to the design of the electronic device 1000.

The sensor driver 200C may receive the control signal I-CS from the main driver 1000C (see FIG. 2), and may provide the coordinate signal I-SS to the main driver 1000C (see FIG. 2). In addition, the sensor driver 200C may receive image information data DIS. The image information data DIS may be provided from the display driver 100C (see FIG. 2) or the main driver 1000C (see FIG. 2).

The image information data DIS may be calculated on the basis of the image data RGB (see FIG. 5). For example, the image information data DIS may include noise information on an image to be displayed on the display layer 100 (see FIG. 5). The sensor driver 200C may generate an output signal on the basis of the image information data DIS including the noise information, and may output the output signal to the sensor layer 200.

The sensor driver 200C may include a sensor control circuit 200C1, a signal generation circuit 200C2, an input detection circuit 200C3, and a switching circuit 200C4. The sensor control circuit 200C1, the signal generation circuit 200C2, and the input detection circuit 200C3 may be implemented in a single chip, or some thereof other than some of the sensor control circuit 200C1, the signal generation circuit 200C2, and the input detection circuit 200C3 may be implemented in different chips.

The sensor control circuit 200C1 controls the operation of the signal generation circuit 200C2 and the switching circuit 200C4, calculates the coordinates of an external input from a driving signal received from the input detection circuit 200C3, or analyzes information transmitted from an active pen from a modulation signal received from the input detection circuit 200C3.

The signal generation circuit 200C2 may provide an output signal (or driving signal) referred to as a TX signal to the sensor layer 200. The signal generation circuit 200C2 outputs an output signal corresponding to an operation mode to the sensor layer 200.

The input detection circuit 200C3 may convert an analogue signal, referred to as an RX signal (or sensing signal), received from the sensor layer 200 to a digital signal. The input detection circuit 200C3 amplifies and then filters the received analogue signal. The input detection circuit 200C3 then may convert the filtered signal to a digital signal.

The switching circuit 200C4 may selectively control the electrical connection between the sensor layer 200 and the signal generation circuit 200C2 and/or the input detection circuit 200C3 according to the control of the sensor control circuit 200C1. The switching circuit 200C4 may connect any one group of the plurality of electrodes 210 and the plurality of cross electrodes 220 to the signal generation circuit 200C2, or may connect each of the plurality of electrodes 210 and the plurality of cross electrodes 220 to the signal generation circuit 200C2 according to the control of the sensor control circuit 200C1. Alternatively, the switching circuit 200C4 may connect one group or all of the plurality of electrodes 210 and the plurality of cross electrodes 220 to the input detection circuit 200C3.

Figure 7A:
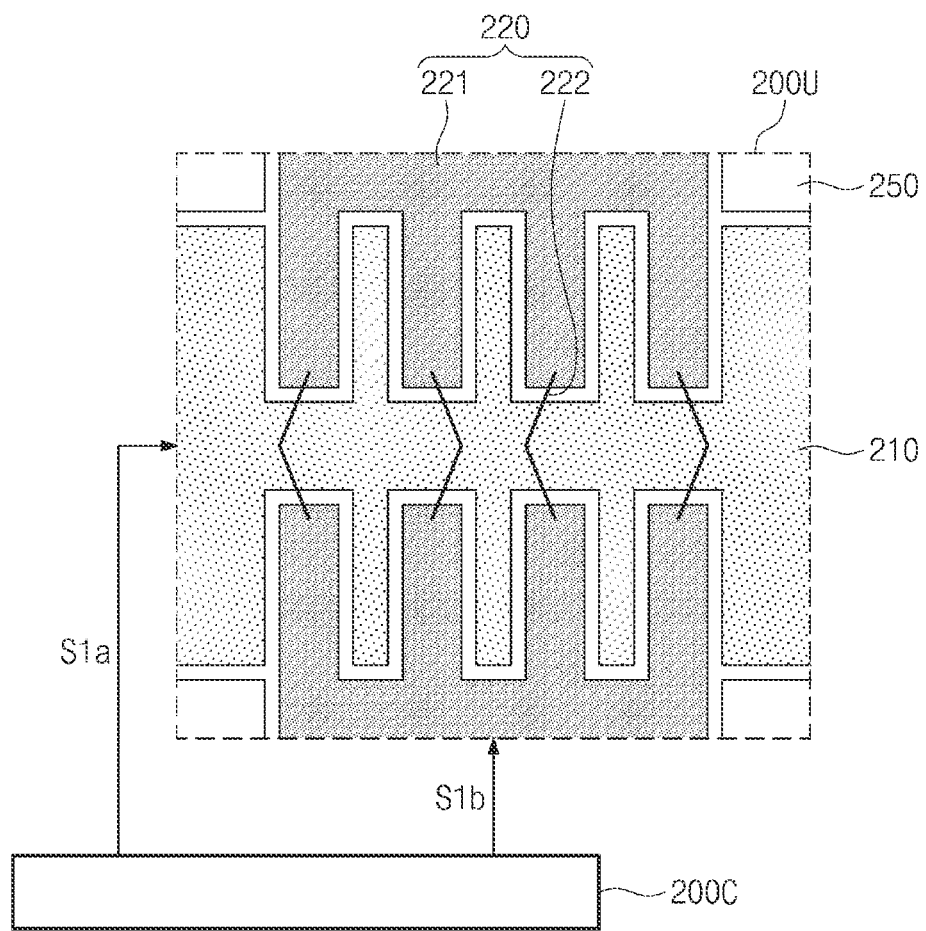
FIG. 7A and FIG. 7B are views for describing a sensor layer operating in a first mode according to some embodiments of the inventive concept.
Figure 7B:
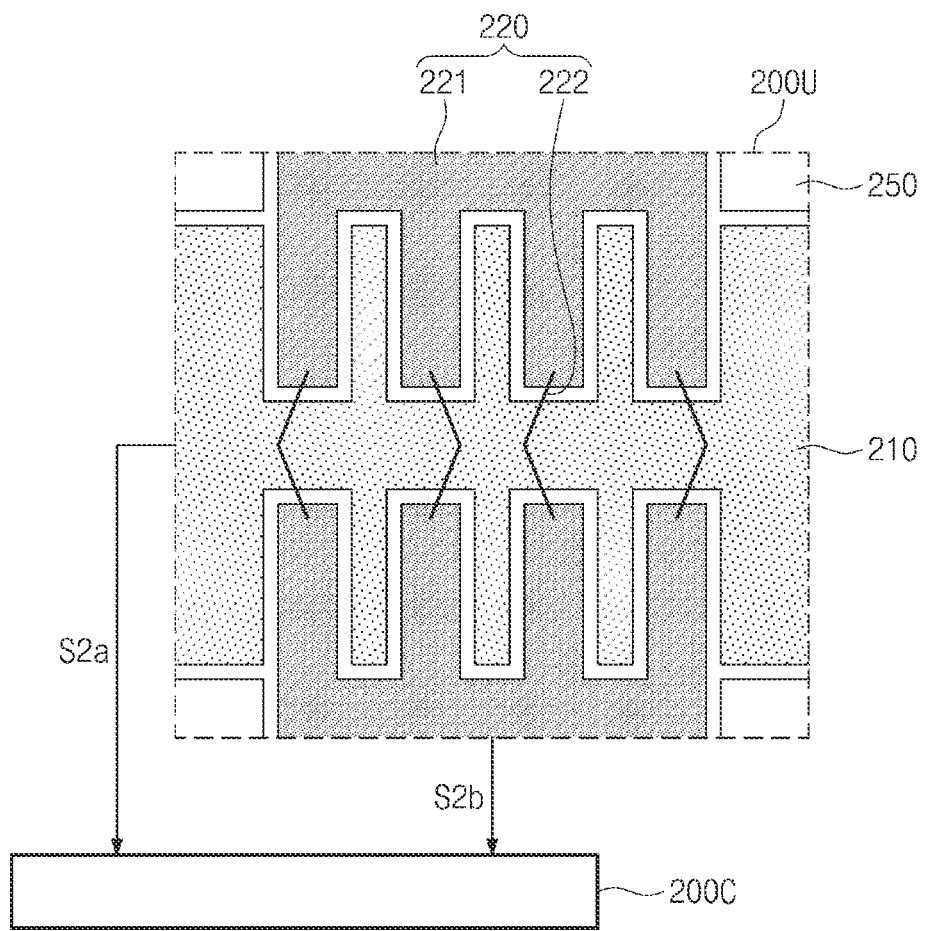

FIG. 7A and FIG. 7B are views for describing a sensor layer operating in a first mode according to some embodiments of the inventive concept.

Referring to FIG. 6, FIG. 7A, and FIG. 7B, a portion of one electrode 210 and a portion of one cross electrode 220 may be defined as one sensing unit 200U. In each of FIG. 7A and FIG. 7B, one sensing unit 200U is enlarged and illustrated.

A cross electrode 220 may include cross patterns 221 and bridge patterns 222 electrically connected to the cross patterns 221. The cross patterns 221 may be spaced apart with the electrode 210 interposed therebetween. The bridge patterns 222 may overlap the electrode 210, and the bridge patterns 222 may cross the electrode 210 while being insulated therefrom.

The cross patterns 221 and the electrode 210 may be located on the same layer, and the bridge patterns 222 may be located on a different layer from the cross patterns 221 and the electrode 210. For example, the cross patterns 221 and the electrode 210 may be included in the second conductive layer 204 (see FIG. 4) and the bridge patterns 222 may be included in the first conductive layer 202 (see FIG. 4), which may be referred to as a bottom bridge structure. However, embodiments according to the inventive concept are not particularly limited thereto. For example, the cross patterns 221 and the electrode 210 may be included in the first conductive layer 202 (see FIG. 4) and the bridge patterns 222 may be included in the second conductive layer 204 (see FIG. 4), which may be referred to as a top bridge structure.

In addition, the sensor layer 200 may further include a dummy pattern 250 located in a region in which the cross patterns 221 and the electrode 210 are not located. The dummy pattern 250 may be a component provided to prevent the electrode 210 and the cross electrode 220 from being viewed from the outside, and the dummy pattern 250 may be a pattern electrically floated. The dummy pattern 250 may be referred to as a floating pattern or a pattern.

Each of the cross patterns 221, the electrode 210, and the dummy pattern 250 may have a mesh structure. In this case, in each of the cross patterns 221, the electrode 210, and the dummy pattern 250, an opening may be defined. However, the embodiments of the inventive concept are not limited thereto. Each of the cross patterns 221, the electrode 210, and the dummy pattern 250 may be configured to be a transparent through-electrode.

Referring to FIG. 7A and FIG. 7B, the first mode may be a mode in which the electronic device 1000 (see FIG. 1) and the input device 2000 (see FIG. 1) transmits/receives data with each other. The operation illustrated in FIG. 7A may be an operation of providing an up-link signal ULS (see FIG. 2) from the electronic device 1000 (see FIG. 1) to the input device 2000 (see FIG. 1). The operation illustrated in FIG. 7B may be an operation of providing a down-link signal DLS (see FIG. 2) from the input device 2000 (see FIG. 1) to the electronic device 1000 (see FIG. 1).

Referring to FIG. 7A, each of the electrode 210 and the cross electrode 220 may be utilized as a transmission electrode configured to provide output signals S1$a$ and S1$b$ (hereinafter, referred to as up-link signals) provided from the sensor driver 200C to the input device 2000 (see FIG. 1). In FIG. 7A, both the electrode 210 and the cross electrode 220 are illustrated, for example, as being utilized as a transmission electrode, but the embodiments of the inventive concept are not particularly limited thereto. For example, either the electrode 210 or the cross electrode 220 may be utilized as a transmission electrode.

Referring to FIG. 7B, each of the electrode 210 and the cross electrode 220 may be utilized as a reception electrode configured to transfer sensing signals S2$a$ and S2$b$ induced from the input device 2000 (see FIG. 1) to the sensor driver 200C. The sensor driver 200C may receive a first sensing signal S2$a$ from the electrode 210, and may receive a second sensing signal S2$b$ from the cross electrode 220.

Figure 8:
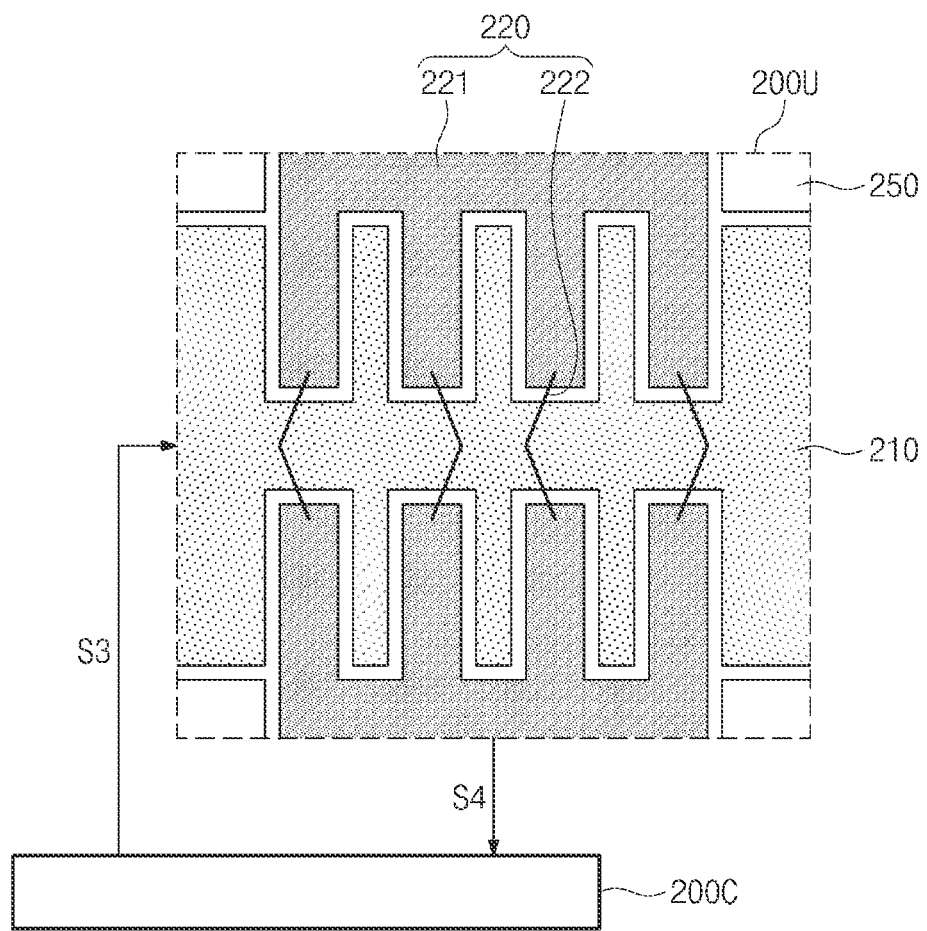
FIG. 8 is a view for describing a sensor layer operating in a second mode according to some embodiments of the inventive concept.

FIG. 8 is a view for describing a sensor layer operating in a second mode according to some embodiments of the inventive concept.

Referring to FIG. 6 and FIG. 8, in the second mode, the sensor driver 200C may sense the second input by the touch 3000 (see FIG. 2). In the second mode, the sensor driver 200C may sense an external input by sensing the amount of change in mutual capacitance formed between the electrode 210 and the cross electrode 220.

The sensor driver 200C may provide an output signal S3 to the electrode 210, and may receive a sensing signal S4 from the cross electrode 220. That is, in the second mode, the electrode 210 may function as a transmission electrode, and the cross electrode 220 may function as a reception electrode. However, the embodiments of the inventive concept are not particularly limited thereto. For example, the electrode 210 may function as a reception electrode, and the cross electrode 220 may function as a transmission electrode.

According to some embodiments of the inventive concept, the sensor driver 200C may receive the image information data DIS (see FIG. 6) extracted from the image data RGB (see FIG. 2), and may control an output signal provided to the sensor layer 200 on the basis of the image information data DIS. Because the sensor driver 200C controls the output signal in correspondence to an image displayed on the display layer 100 (see FIG. 2), the sensing performance of the electronic device 1000 (see FIG. 1) may be improved. A detailed description thereof will be followed.

Figure 9A:
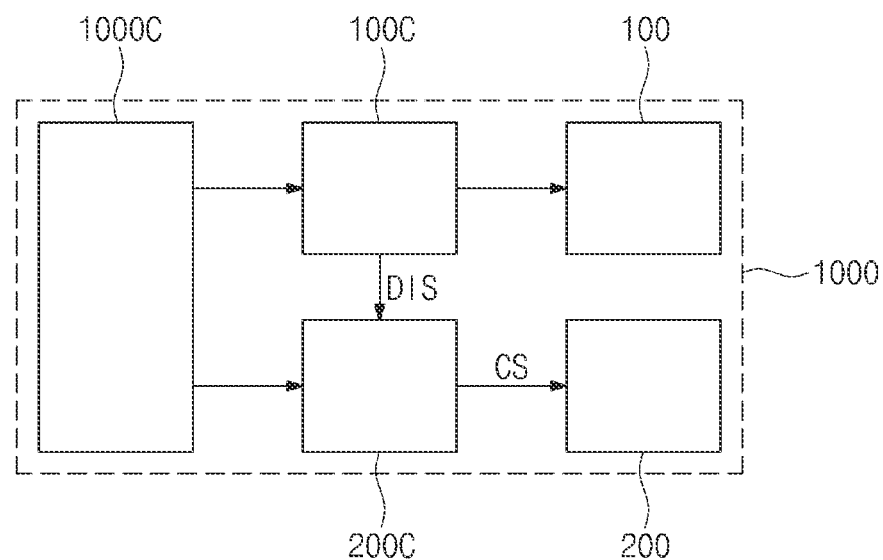
FIG. 9A is a block diagram of an electronic device according to some embodiments of the inventive concept.

FIG. 9A is a block diagram of an electronic device according to some embodiments of the inventive concept.

Referring to FIG. 9A, the display driver 100C may provide the image information data DIS to the sensor driver 200C. The sensor driver 200C may generate an output signal CS in correspondence to the image information data DIS, and may output the output signal CS to the sensor layer 200.

In the first mode, the output signal CS may be an up-link signal, and in the second mode, the output signal CS may be a driving signal (or TX signal). The sensor driver 200C may generation an up-link signal on the basis of the image information data DIS, or may control the frequency of the driving signal on the basis of the image information data DIS. Alternatively, the sensor driver 200C may generate an up-link signal on the basis of the image information data DIS, and may control the frequency of the driving signal.

For example, when an up-link signal is generated on the basis of the image information data DIS, the up-link signal may be generated to include the image information data DIS. In this case, the input device 2000 (see FIG. 2) may receive the image information data DIS, and may control the intensity of the down-link signal DLS (see FIG. 2) output from the input device 2000 (see FIG. 2) in correspondence to the image information data DIS.

For example, when the frequency of the driving signal is controlled on the basis of the image information data DIS, the sensor driver 200C may detect a frequency which is least affected by noise on the basis of image information data DIS, and may control the frequency of the driving signal to the corresponding frequency.

Figure 9B:
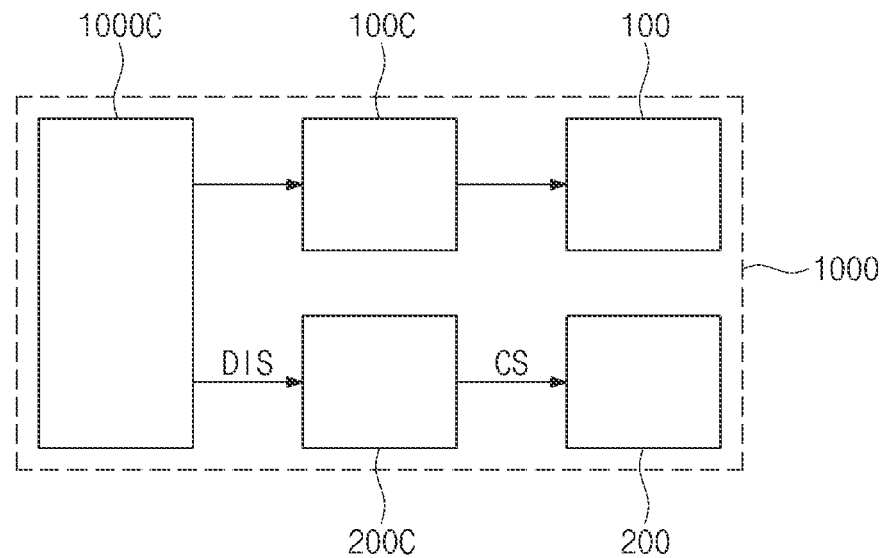
FIG. 9B is a block diagram of an electronic device according to some embodiments of the inventive concept.

FIG. 9B is a block diagram of an electronic device according to some embodiments of the inventive concept.

When compared with FIG. 9A, the sensor driver 200C of FIG. 9B may receive the image information data DIS from the main driver 1000C.

Figure 10:
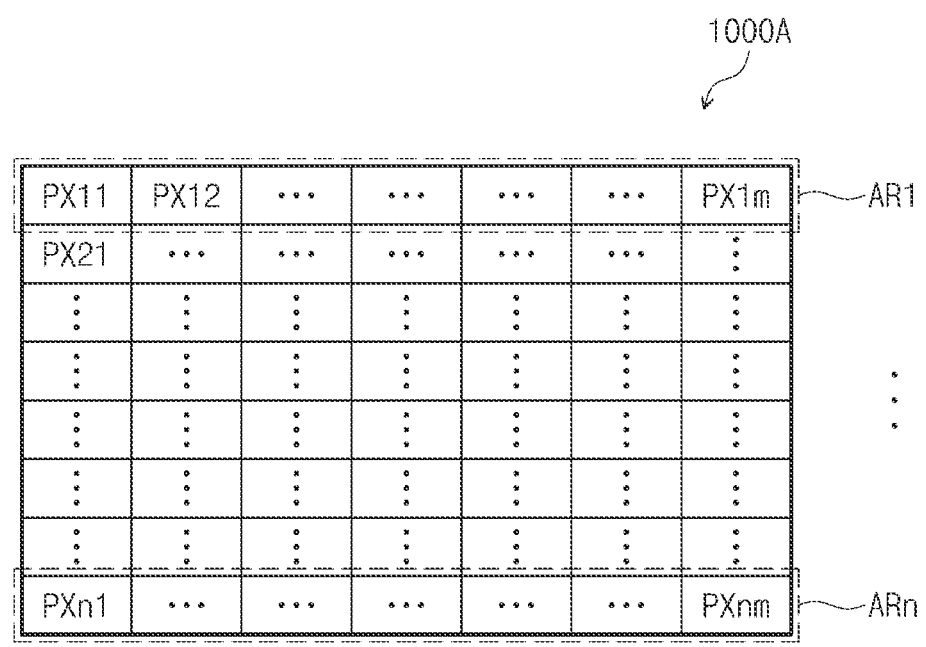
FIG. 10 is a view illustrating regions of a display layer according to some embodiments of the present invention.

FIG. 10 is a view illustrating regions of a display layer according to some embodiments of the present invention.

Referring to FIG. 5 and FIG. 10, in the active region 1000A, a plurality of pixels PX11 to PXnm may be arranged. The plurality of pixels PX11 to PXnm may be arranged along the first direction DR1 and the second direction DR2.

A plurality of regions AR1 to ARn may be defined in the active region 1000A. For example, when n number of pixels are located in the second direction DR2, the number of the plurality of regions AR1 to ARn may be n. n may be a positive integer.

Each of the plurality of regions AR1 to ARn may include a row of pixels arranged along the first direction DR1. For example, a first region AR1 may include m number of pixels PX11 to PX1$m$. An n-th region ARn may include m number of pixels Pxn1 to PXnm.

The image information data DIS (see FIG. 6) may include noise information on an image displayed on the active region 1000A. The noise information may be noise information on a horizontal line or a horizontal frequency component of the image. For example, the noise information may be derived from the change or displacement of the level of a voltage output from the data driving circuit 100C3 over time. For example, when an image displayed on the active region 1000A has the same gray level as black or white, noise may be at the lowest level. In addition, when an image displayed on the active region 1000A is alternately displayed in white and black for each row, noise may be at the maximum level.

According to some embodiments of the inventive concept, the noise information may be calculated on the basis of average values of gray levels of the image data RGB corresponding to each of the plurality of regions AR1 to ARn. Further description thereof will be provided below.

FIG. 11A is a view displaying the gray level of each pixel. FIG. 11B is a view displaying the gray level of each pixel.

Referring to FIG. 10, FIG. 11A, and FIG. 11B, the display driver 100C (see FIG. 9A) or a main driver 1000C1 (see FIG. 9B) calculates a plurality of average gray levels corresponding to each of the plurality of regions AR1 to ARn.

In each of FIG. 11A and FIG. 11B, the gray level corresponding to each pixel in one frame is displayed. The gray level may have a value of one of 0 to 255, but is not particularly limited thereto.

The image information data DIS (see FIG. 6) may be determined on the basis of a standard deviation of differences derived by the plurality of average gray levels. For example, each of the plurality of average gray levels may be an average value of gray levels displayed in a corresponding region among the plurality of regions AR1 to ARn. The differences may mean the difference in average gray levels of two regions adjacent to each other.

FIG. 11A may illustrate a case in which an image displayed on the active region 1000A has the same gray level, for example, "k," such as black or white. Therefore, the average gray level of each of the plurality of regions AR1 to ARn may be "k."

In FIG. 11A, the differences may include the difference between the average gray level of the first region AR1 and the average gray level of a second region AR2, the difference between the average gray level of the second region AR2 and the average gray level of a third region AR3, . . . and the difference between the average gray level of an n–1-th region ARn–1 and the average gray level of the n-th region ARn. In the image illustrated in FIG. 11A, all pixels display the same gray level, so that the difference may be "0," and the standard deviation may be "0."

In FIG. 11B, an image displayed on the active region 1000A may be alternately displayed in white and black for each row. That is, the maximum gray level and the minimum gray level may be alternately displayed on the active region 1000A. The average gray level of the first region AR1 may be "255," the average gray level of the second region AR2 may be "0," the average gray level of the third region AR3 may be "255," . . . the average gray level of the n–1-th region ARn–1 may be "255," and the average gray level of the n-th region ARn may be "0."

In FIG. 11B, the differences may include a first difference between the average gray level of the first region AR1 and the average gray level of the second region AR2, a second difference between the average gray level of the second region AR2 and the average gray level of the third region AR3, . . . and a third difference between the average gray level of the n–1-th region ARn–1 and the average gray level of the n-th region ARn. For example, the first difference and the third difference may be "+255," and the second difference may be "–255." The standard deviation of the differences may be "255."

The image information data DIS (see FIG. 6) may be determined on the basis of the standard deviation. For example, when 1 byte is allocated to the image information data DIS, the image information data DIS may express the standard deviation as it is. For example, the image information data DIS calculated on the basis of the image data RGB (see FIG. 2) corresponding to FIG. 11A may be "00000000," and the image information data DIS calculated on the basis of the image data RGB (see FIG. 2) corresponding to FIG. 11B may be "11111111."

For example, when 1 bit, 2 bits, or 4 bits are allocated to the image information data DIS (see FIG. 6), the image information data DIS (see FIG. 6) may include information on a standard deviation section. When 1 bit is allocated to the image information data DIS (see FIG. 6), the image information data DIS (see FIG. 6) may include information on whether the standard deviation corresponds to either a first section in which the standard deviation is less than or equal to a reference value or a second section in which the standard deviation is greater than the reference value. The reference value may be, for example, 128, but this is only an example. The embodiments of the inventive concept are not particularly limited thereto.

Figure 12:
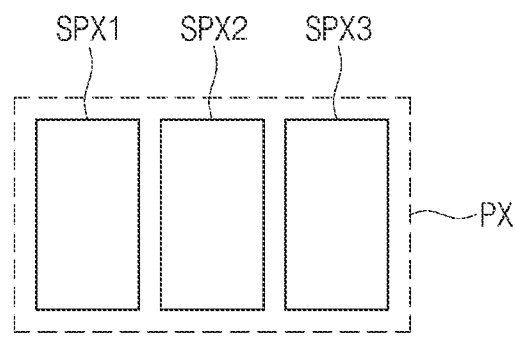
FIG. 12 is a view illustrating one pixel according to some embodiments of the present invention.

FIG. 12 is a view illustrating one pixel according to some embodiments of the present invention.

Referring to FIG. 12, one pixel PX may include a first sub-pixel SPX1, a second sub-pixel SPX2, and a third sub-pixel SPX3 providing different colors. The display driver 100C (see FIG. 9A) or the main driver 1000C1 (see FIG. 9B) calculates a plurality of average gray levels corresponding to each of the plurality of regions AR1 to ARn. The image information data DIS (see FIG. 6) may be determined on the basis of a standard deviation of differences derived by the plurality of average gray levels.

Each of the plurality of average gray levels may include a first sub-average gray level corresponding to the first sub-pixel SPX1, a second sub-average gray level corresponding to the second sub-pixel SPX2, and third sub-average gray level corresponding to the third sub-pixel SPX3.

The standard deviation may be determined on the basis of the maximum standard deviation of a first sub-standard deviation calculated on the basis of the first sub-average gray level, a second sub-standard deviation calculated on the basis of the second sub-average gray level, and a third sub-standard deviation calculated on the basis of the third sub-average gray level.

Figure 13:
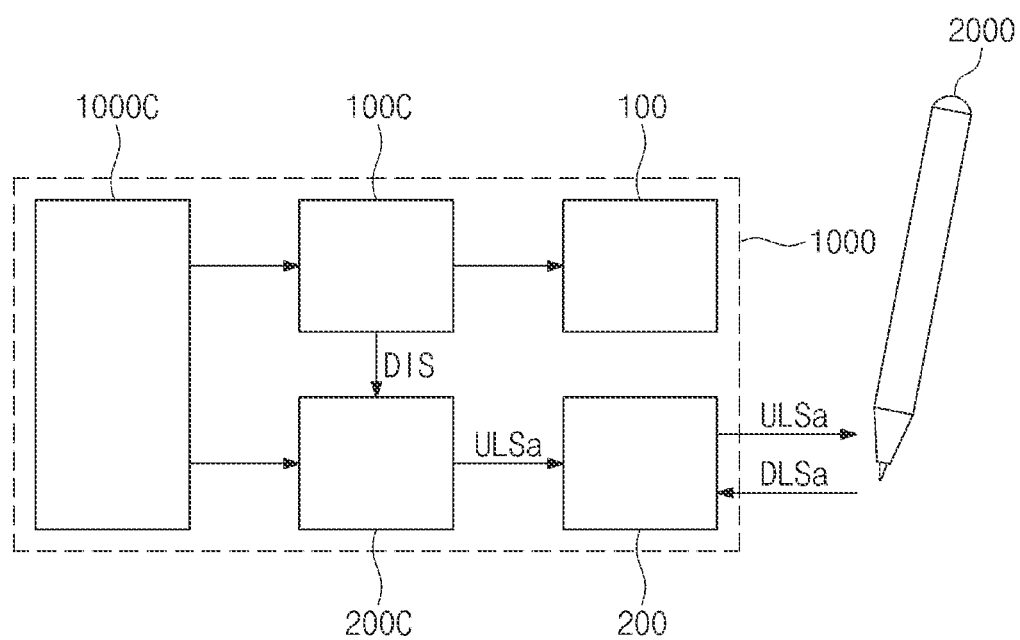
FIG. 13 is a block diagram of an electronic device according to some embodiments of the inventive concept.

FIG. 13 is a block diagram of an electronic device according to some embodiments of the inventive concept.

Referring to FIG. 13, the sensor driver 200C receives the image information data DIS. The sensor driver 200C may generate an output signal ULSa (hereinafter, referred to as up-link signal) on the basis of the image information data DIS, and may output the output signal ULSa to the sensor layer 200. The up-link signal ULSa may include the image information data DIS.

The input device 2000 may output a down-link signal DLSa after receiving the up-link signal ULSa. The intensity of the down-link signal DLSa may be changed in correspondence to the image information data DIS. For example, when the image information data DIS has a high frequency component, the intensity of the down-link signal DLSa may increase, and when the image information data DIS has a low frequency component, the intensity of the down-link signal DLSa may decrease. When the image information data DIS has a high frequency component, it means that the change in the level of a voltage output from the data driving circuit 100C3 is large, and when the image information data DIS has a low frequency component, it means that the change in the level of the voltage output from the data driving circuit 100C3 is small. That is, noise may be larger in the high frequency component than in the low frequency component.

According to some embodiments of the inventive concept, the amount of noise caused by an image to be displayed in one frame is predicted, and accordingly, the intensity of the down-link signal DLSa output from the input device 2000 may be adjusted. Therefore, the intensity (or voltage level) of the down-link signal DLSa output from the input device 2000 is increased in a high-noise frame section, so that the sensing performance of the electronic device 1000 may be improved. In addition, the intensity (or voltage level) of the down-link signal DLSa output from the input device 2000 is decreased in a low-noise frame section, so that the power consumption of the input device 2000 may be lowered.

Figure 14A:
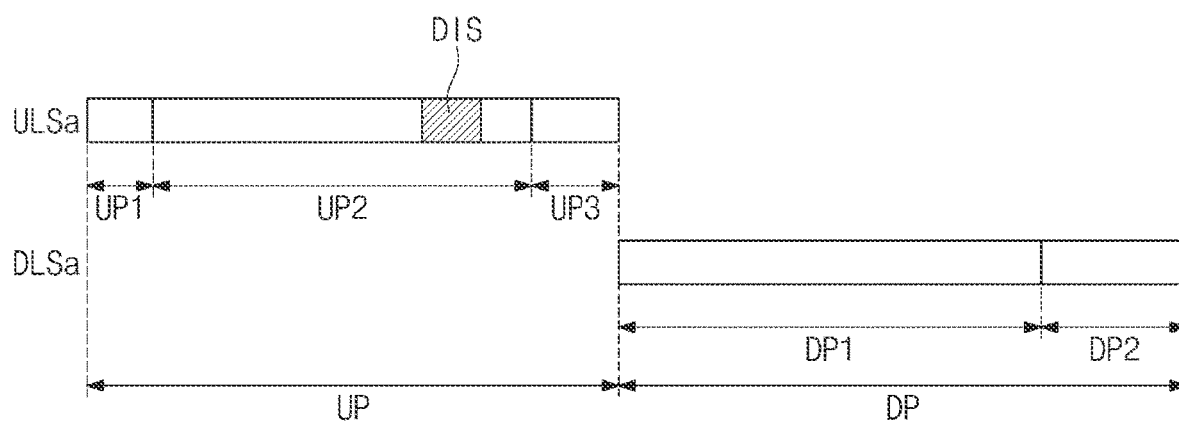
FIG. 14A is a view illustrating the operation of an interface device according to some embodiments of the inventive concept.

FIG. 14A is a view illustrating the operation of an interface device according to some embodiments of the inventive concept.

Referring to FIG. 13 and FIG. 14A, the first mode may include an up-link section UP and a down-link section DP. The up-link section UP is a section in which the sensor driver 200C outputs the up-link signal ULSa to the sensor layer 200, and the down-link section DP may be a section in which the sensor driver 200C receives the down-link signal DLSa through the sensor layer 200. That is, the up-link section UP may be a section in which the operation described with reference to FIG. 7A is performed, and the down-link section DP may be a section in which the operation described with reference to FIG. 7B is performed.

FIG. 14A illustrates an example of the up-link signal ULSa and the down-link signal DLSa. The up-link signal ULSa may be divided into a first section UP1, a second section UP2, and a third section UP3. The first section UP1 is a preamble section, and may be a section for bit synchronization or frame synchronization. The second section UP2 is a data communication section, and may be a section including information to be provided to the input device 2000. The third section UP3 may be a section in which a bit for detecting and correcting an error is provided. The configuration of the up-link signal ULSa is just an example, and the embodiments of the inventive concept are not particularly limited thereto.

In the second section UP2, the image information data DIS may be included. The image information data DIS may include noise information on an image to be displayed on the display layer 100 (see FIG. 2). The image information data DIS may have a length of 1 byte, but is not particularly limited thereto. For example, the image information data DIS may have a length of 1 bit, 2 bits, or 4 bits.

The intensity of the down-link signal DLSa may be adjusted on the basis of the image information data DIS. The down-link signal DLSa may include a first section DP1 and a second section DP2. The first section DP1 may be a section in which a driving signal (or TX signal) is output from the input device 2000. The driving signal is an oscillation signal which is continuously transmitted, and may be referred to as a burst signal. The second section DP2 is a data communication section, and may be a section in which a modulation signal indicating the information of the input device 2000 is output. For example, the down-link signal DLSa of the second section DP2 may include the pen pressure information or slope information of the input device 2000.

Figure 14B:
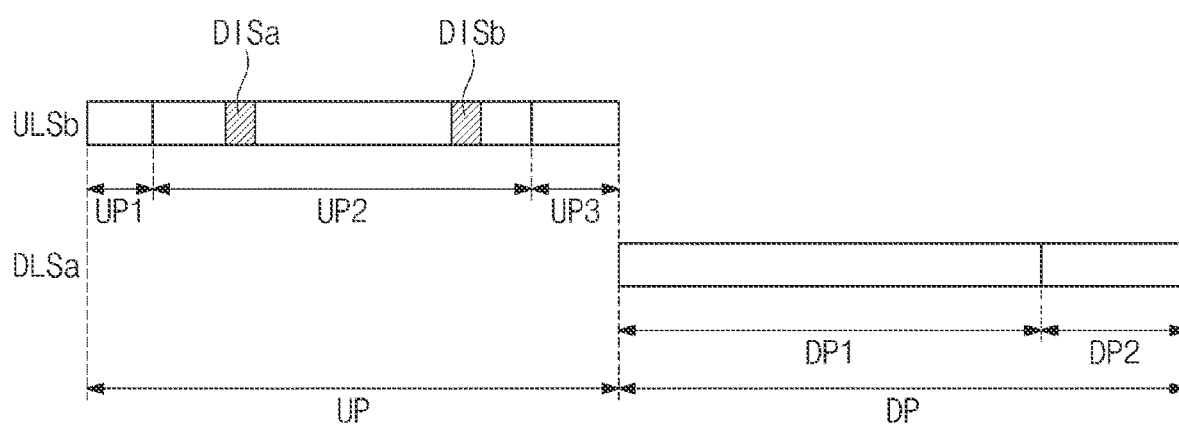
FIG. 14B is a view illustrating the operation of an interface device according to some embodiments of the inventive concept.

FIG. 14B is a view illustrating the operation of an interface device according to some embodiments of the inventive concept.

An up-link signal ULSb illustrated in FIG. 14B is different from the up-link signal ULSa illustrated in FIG. 14A, which will be described hereinafter. The up-link signal ULSb may be divided into a first section UP1, a second section UP2, and a third section UP3. In the second section UP2, image information data DISa and DISb may be included. The image information data DISa and DISb may include noise information on an image to be displayed on the display layer 100 (see FIG. 2). The image information data DISa and DISb may be separated into a bit (e.g., a set or predetermined bit) and included in the second section UP2.

The image information data DISa and DISb may be divided into first partial data DISa and second partial data DISb and provided in the second section UP2. FIG. 14B illustrates, for example that one piece of image information data DISa and DISb is divided into two pieces of partial data, but the embodiments of the inventive concept are not particularly limited thereto. The image information data DISa and DISb may be divided into three or more partial data.

According to some embodiments of the inventive concept, the first partial data DISa and the second partial data DISb may not all be included in the up-link signal ULSb of one frame. For example, the first partial data DISa may be included in an n-th up-link signal, and the second partial data DISb may be included in an n+1-th up-link signal. The n+1-th up-link signal may be a signal provided from an n+1-th up-link section after an n-th up-link section and an n-th down-link section.

Figure 15:
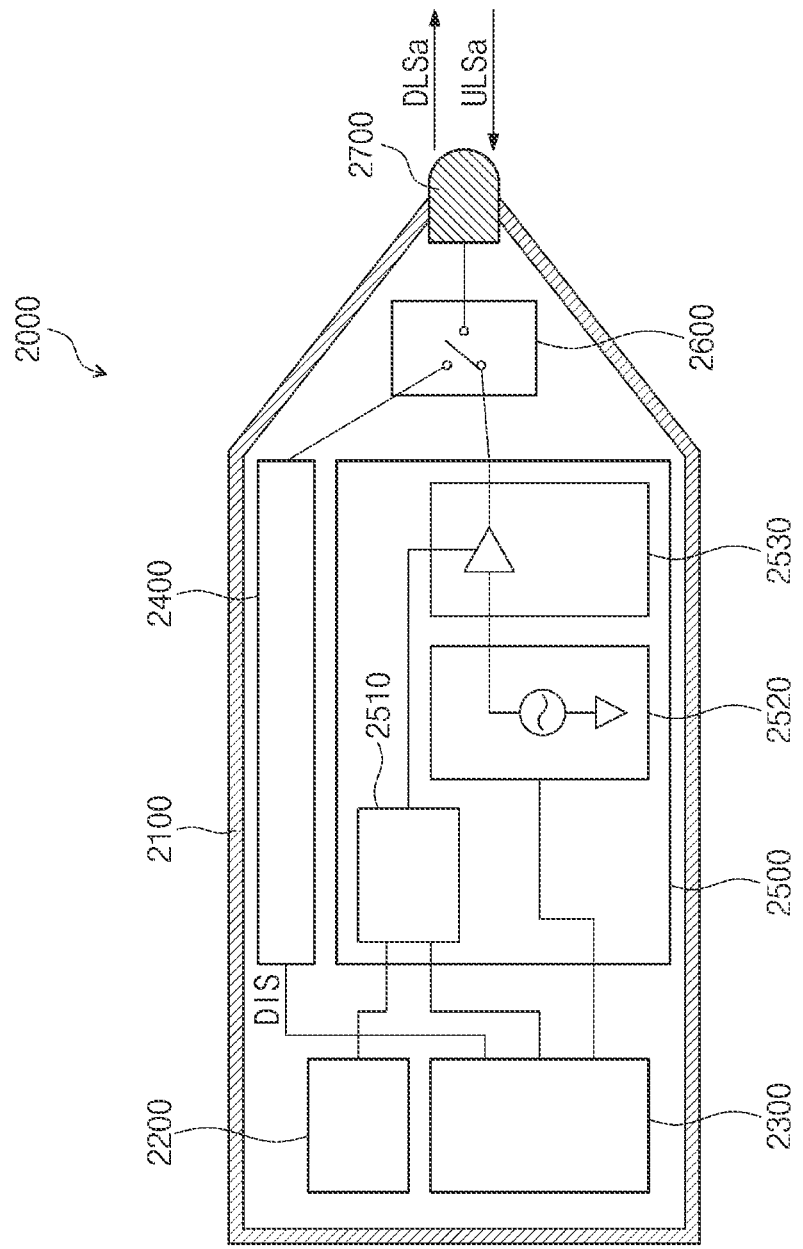
FIG. 15 is a block diagram of an input device according to some embodiments of the inventive concept.

FIG. 15 is a block diagram of an input device according to some embodiments of the inventive concept.

Referring to FIG. 15, the input device 2000 may include a housing 2100, a power source 2200, a controller 2300, a reception circuit 2400, a transmission circuit 2500, a switch circuit 2600, and a pen tip 2700. However, components constituting the input device 2000 are not limited to the components listed above. For example, the input device 2000 may further include an electrode switch for switching to a signal transmission mode or a signal reception mode, a pressure sensor for sensing pressure, a memory for storing information (e.g., set or predetermined information), a rotation sensor for sensing rotation, or the like.

The housing 2100 may have a pen shape, and an accommodation space may be formed therein. In the accommodation space defined inside the housing 2100, the power source 2200, the controller 2300, the reception circuit 2400, the transmission circuit 2500, the switch circuit 2600, and the pen tip 2700 may be accommodated.

The power source 2200 may supply power to the controller 2300, the reception circuit 2400, the transmission circuit 2500, and the switch circuit 2600 inside the input device 2000. The power source 2200 may include a battery or a high-capacity capacitor.

The controller 2300 may control the operation of the input device 2000. The controller 2300 may be an application-specific integrated circuit (ASIC). The controller 2300 may be configured to operate according to a designed program.

The reception circuit 2400 and the transmission circuit 2500 may be referred to as a communication module. The reception circuit 2400 may receive the up-link signal ULSa provided from the sensor layer 200 (see FIG. 6). The reception circuit 2400 may modulate the up-link signal ULSa to a signal processable in the controller 2300.

The image information data DIS may be transferred from the reception circuit 2400 to the controller 2300. The controller 2300 calculates or determines the intensity of the down-link signal DLSa on the basis of the image information data DIS. In the controller 2300, a lookup table with matching voltage values corresponding to the image information data DIS may be stored, or a logic for calculating a voltage value on the basis of the image information data DIS may be included.

The transmission circuit 2500 may include a voltage adjustment circuit 2510, a modulation circuit 2520, and a booster circuit 2530. The controller 2300 may adjust the voltage of the voltage adjustment circuit 2510 on the basis of the image information data DIS. The modulation circuit 2520 may be a component configured to change the frequency according to the changed voltage, and may be referred to as an oscillator. The booster circuit 2530 may receive a signal from the voltage adjustment circuit 2510 and the modulation circuit 2520, and then may output the down-link signal DLSa.

The operation of the switch circuit 2600 may be controlled by the controller 2300. For example, in an up-link section, the switch circuit 2600 may connect the pen tip 2700 and the reception circuit 2400, and in a down-link section, the switch circuit 2600 may connect the pen tip 2700 and the transmission circuit 2500.

The pen tip 2700 may be electrically connected to the reception circuit 2400 or the transmission circuit 2500 through the switch circuit 2600. A portion of the pen tip 2700 may protrude from the housing 2100. Alternatively, the input device 2000 may further include a cover housing which covers the pen tip 2700 exposed from the housing 2100. Alternatively, the pen tip 2700 may be embedded inside the housing 2100.

Figure 16A:
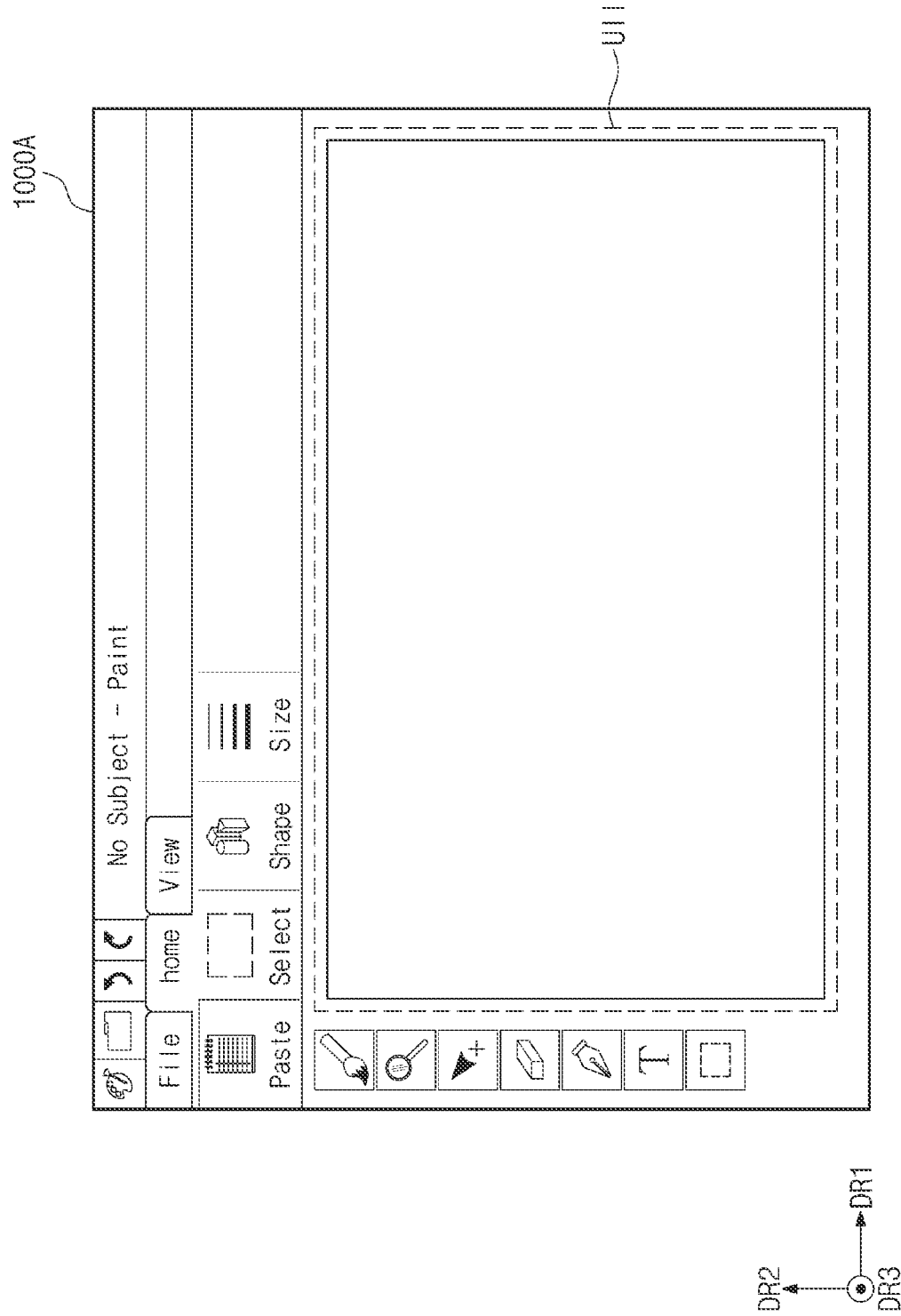
FIG. 16A is a plan view illustrating a screen displayed on a display layer according to some embodiments of the inventive concept.
Figure 16B:
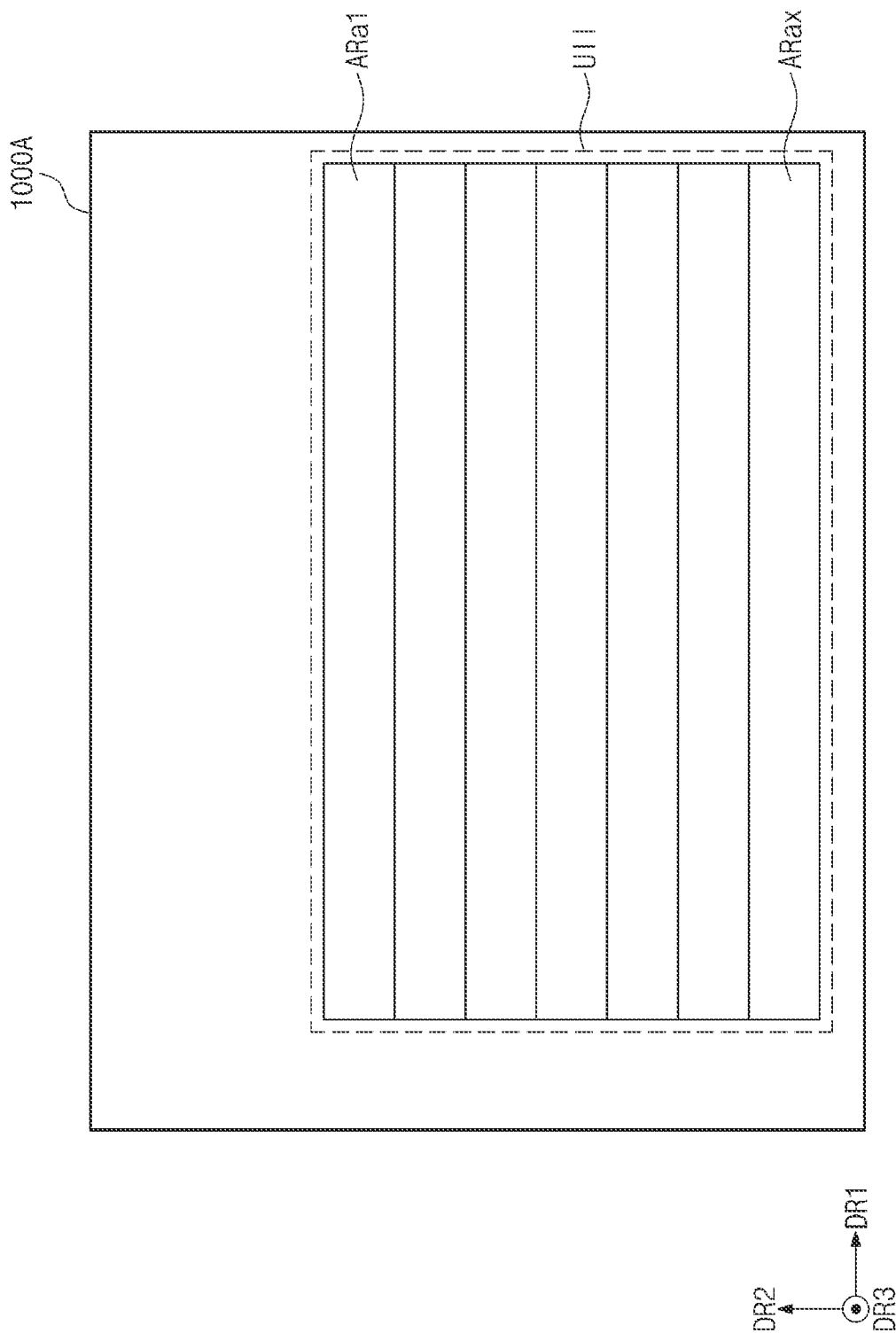
FIG. 16B is a view illustrating a plurality of regions of a display layer according to some embodiments of the present invention.

FIG. 16A is a plan view illustrating a screen displayed on a display layer according to some embodiments of the inventive concept. FIG. 16B is a view illustrating a plurality of regions of a display layer according to some embodiments of the present invention.

Referring to FIG. 16A, an image displayed on the active region 1000A is illustrated. The image may include an input region UII in which a user interface configured to induce an input by the input device 2000 (see FIG. 15) is displayed. The frequency of input by the input device 2000 (see FIG. 15) may be higher than other regions around the input region.

According to some embodiments of the inventive concept, the display driver 100C (see FIG. 9A) or the main driver 1000C1 (see FIG. 9B) may calculate image information data on the basis of noise information on the input region UII having a relatively higher frequency of input.

Referring to FIG. 16B, the display driver 100C (see FIG. 9A) or the main driver 1000C (see FIG. 9B) calculates a plurality of average gray levels respectively corresponding to each of a plurality of regions ARa1 to ARax. The plurality of regions ARa1 to ARax may be defined in the input region UII. The noise information included in the image information data may be information on an image of one frame to be displayed in the input region UII.

Figure 17:
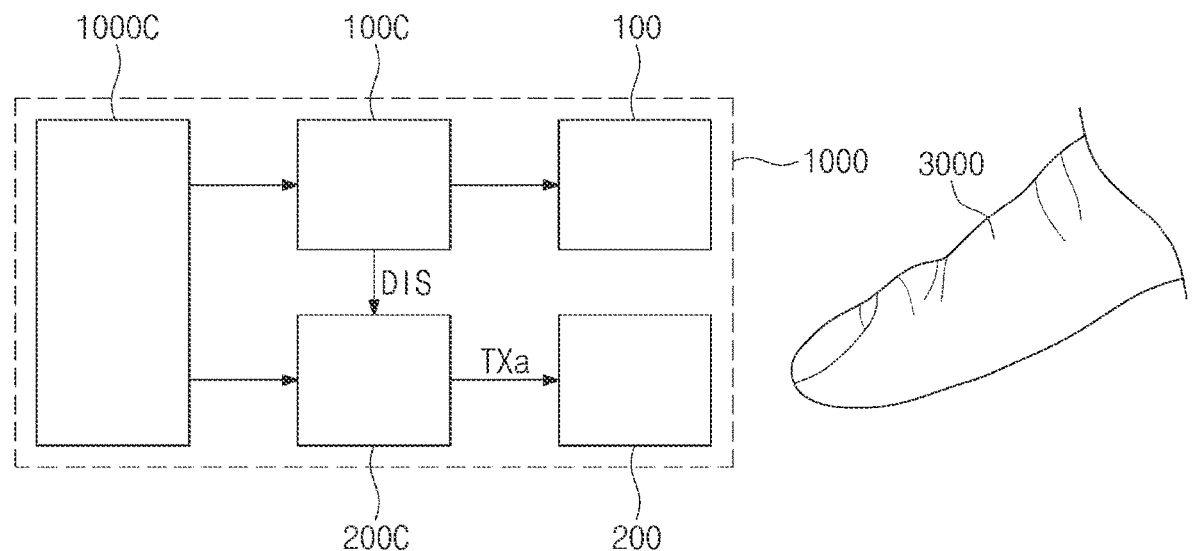
FIG. 17 is a block diagram of an electronic device according to some embodiments of the inventive concept.

FIG. 17 is a block diagram of an electronic device according to some embodiments of the inventive concept.

Referring to FIG. 17, the sensor driver 200C receives the image information data DIS. The sensor driver 200C may generate an output signal TXa on the basis of the image information data DIS, and may output the output signal TXa to the sensor layer 200. The frequency of the output signal TXa may be changed on the basis of the image information data DIS.

The output signal TXa may be provided to the plurality of electrodes 210 (see FIG. 6). Mutual capacitance may be formed between the plurality of electrodes 210 (see FIG. 6) and the plurality of cross electrodes 220 (see FIG. 5). The sensor driver 200C may sense the touch 3000 by sensing the amount of change in the mutual capacitance.

Figure 18:
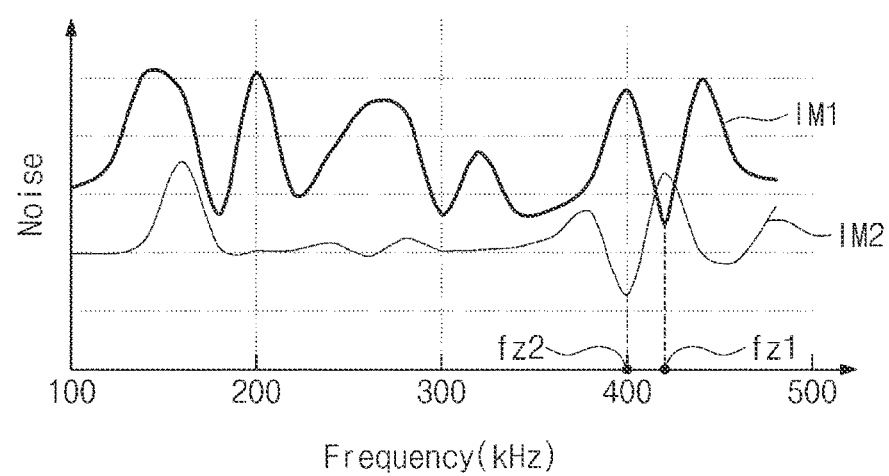
FIG. 18 is a graph illustrating a noise by frequency according to an image displayed in one frame.
Figure 19:
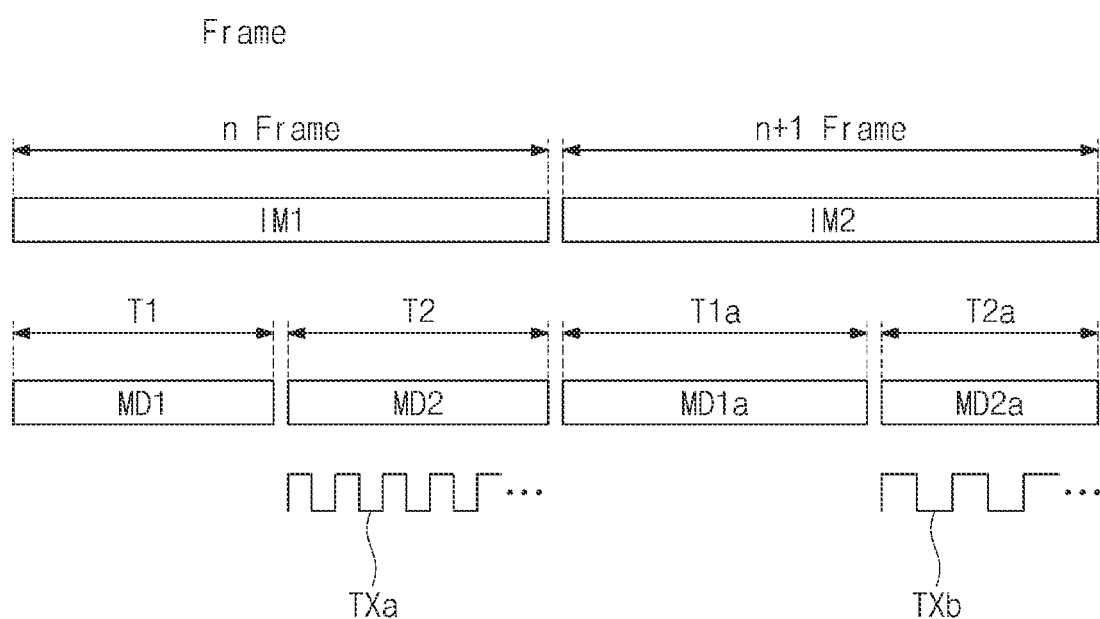
FIG. 19 is a view illustrating the operation of a sensor driver, and a touch driving signal.

FIG. 18 is a graph illustrating a noise by frequency according to an image displayed in one frame. FIG. 19 is a view illustrating the operation of a sensor driver, and a touch driving signal.

Referring to FIG. 17 and FIG. 18, a noise pattern according to a frequency is illustrated. The frequency may be the frequency of the output signal TXa. For example, when a first image IM1 is displayed, the output signal TXa may have low noise at a first driving frequency fz1, and when a second image IM2 is displayed, the output signal TXa may have low noise at a second driving frequency fz2.

According to some embodiments of the inventive concept, the sensor driver 200C may change the driving frequency of the output signal TXa to a driving frequency (e.g., a set or predetermined driving frequency) based on the image information data DIS, and drive the output signal TXa whose driving frequency has been changed.

Referring to FIG. 17 and FIG. 19, when the first image IM1 is displayed in an n frame, the second image IM2 may be displayed in an n+1 frame. In the n frame, a first mode MD1 for sensing an input by the input device 2000 (see FIG. 2) and a second mode MD2 for sensing an input by the touch 3000 (see FIG. 2) may sequentially proceed, and in the n+1 frame, a first mode MD1a and a second mode MD2a may sequentially proceed. However, the order in which the first mode MD1 or MD1a and the second mode MD2 or MD2a are operated is not particularly limited thereto. In addition, FIG. 19 illustrates, for example, that the first mode MD1 or MD1a and the second mode MD2 or MD2a are each operated once in one frame, but the embodiments of the inventive concept are not limited thereto.

In the n frame, the output signal TXa in the second mode MD2 may have the first driving frequency fz1. The first driving frequency fz1 may be a frequency which is least affected by noise caused by the first image IM1. In the n frame, the first mode MD1 may be operated for a first time T1, and the second mode MD2 may be operated for a second time T2.

Thereafter, an image displayed in the n+1 frame may be change to the second image IM2. The sensor driver 200C may change the frequency of the output signal TXb to the second driving frequency fz2 on the basis of the image information data DIS, and may output the output signal TXb whose frequency has been changed. The second driving frequency fz2 may be a frequency which is least affected by noise caused by the second image IM2.

When the influence of noise is great, the operation time of the second mode MD2 or MD2a should be increased in order to increase the accuracy of an input by the touch 3000. However, according to some embodiments of the inventive concept, in order to be less affected by noise, the sensor driver 200C adjusts the frequency of the output signal TXa or TXb on the basis of the image information data DIS, and outputs the output signal TXa or TXb whose frequency has been adjusted. Therefore, the operation time of the second mode MD2 may not be increased.

For example, referring to FIG. 18, the level of noise at the second driving frequency fz2 when the second image IM2 is displayed may be lower than the level of noise at the first driving frequency fz1 when the first image IM1 is displayed. In this case, a second time T2a of the second mode MD2a in the n+1 frame may be reduced compared to the second time T2 of the second mode MD2 in the n frame. Accordingly, a first time T1a of the first mode MD1a in the n+1 frame may be increased compared to the first time T1 of the first mode MD1 in the n frame.

According to some embodiments of the inventive concept, the sensor driver 200C sets and then outputs the output signal TXa for sensing an input by the touch 3000 to an optimal frequency, so that the sensing sensitivity of the touch may be improved. Also, time for sensing the touch 3000 may be shortened because the influence of noise is reduced, and accordingly, time for sensing an input by the input device 2000 (see FIG. 2) may be secured.

As described above, the amount of noise caused by an image to be displayed in one frame is predicted, and accordingly, the intensity of a down-link signal output from an input device may be adjusted. Therefore, the intensity (or voltage level) of the down-link signal output from the input device is increased in a high-noise frame section, so that the sensing performance of an electronic device may be improved. In addition, the intensity (or voltage level) of the down-link signal output from the input device is decreased in a low-noise frame section, so that the power consumption of the input device may be lowered.

Also, on the basis of noise information, a sensor driver sets and then outputs an output signal for sensing an input by a touch to an optimal frequency which is less affected by noise, so that the sensing sensitivity of the touch may be improved. Also, time for sensing a touch may be shortened because the influence of noise is reduced, and accordingly, time for sensing an input by the input device may be secured.

Although the inventive concept has been described with reference to preferred embodiments of the inventive concept, it will be understood by those skilled in the art that various modifications and changes in form and details may be made therein without departing from the spirit and scope of the inventive concept as set forth in the following claims. Accordingly, the technical scope of the inventive concept is not intended to be limited to the contents set forth in the detailed description of the specification, but is intended to be defined by the appended claims, and their equivalents.

What is claimed is:

1. An electronic device comprising:
a display layer configured to display an image based on image data and having a plurality of regions defined thereon;
a sensor layer on the display layer; and
a sensor driver configured to receive image information data calculated based on the image data, to generate an output signal based on the image information data, and to provide the output signal to the sensor layer,
wherein the image information data includes noise information on the image, the noise information being calculated based on the plurality of regions.

2. The electronic device of claim 1, wherein the image information data is determined based on a standard deviation of differences derived by a plurality of average gray levels, wherein:
each of the plurality of average gray levels is an average value of gray levels displayed in a corresponding region among the plurality of regions; and
each of the differences is a difference between an average gray level of one region among the plurality of regions and an average gray level of another region adjacent to the one region.

3. The electronic device of claim 2, wherein:
the display layer comprises a plurality of pixels arranged along a first direction and a second direction intersecting the first direction, wherein each of the plurality of pixels includes a first sub-pixel, a second sub-pixel, and a third sub-pixel configured to display different colors,
each of the plurality of average gray levels comprises a first sub-average gray level corresponding to the first sub-pixel, a second sub-average gray level corresponding to the second sub-pixel, and a third sub-average gray level corresponding to the third sub-pixel,
the standard deviation comprises a first sub-standard deviation calculated based on the first sub-average gray level, a second sub-standard deviation calculated based on the second sub-average gray level, and a third sub-standard deviation calculated based on the third sub-average gray level, and
the image information data is determined based on a maximum standard deviation among the first sub-standard deviation, the second sub-standard deviation, and the third sub-standard deviation.

4. The electronic device of claim 1, wherein the display layer comprises a plurality of pixels arranged along a first direction and a second direction intersecting the first direction, and each of the plurality of regions comprises a row of pixels arranged along the first direction among the plurality of pixels.

5. The electronic device of claim 1, further comprising a display driver electrically connected to the display layer and configured to control the display layer, wherein the image information data is provided from the display driver to the sensor driver.

6. The electronic device of claim 1, further comprising:
a display driver electrically connected to the display layer and configured to control the display layer; and
a main controller configured to control the display driver and the sensor driver,
wherein the main controller is configured to provide the image information data to the sensor driver.

7. The electronic device of claim 1, wherein the sensor driver is configured to operate in a first mode for sensing an input by an input device which outputs a down-link signal or in a second mode for sensing an input by a touch.

8. The electronic device of claim 7, wherein the first mode comprises an up-link section in which the sensor driver is configured to output an up-link signal to the sensor layer and a down-link section in which the sensor driver is configured to receive the down-link signal through the sensor layer, wherein the up-link signal includes the image information data and an intensity of the down-link signal is changed in correspondence to the image information data.

9. The electronic device of claim 7, wherein an input region in which a user interface for inducing an input by the input device is displayed is defined on the display layer, wherein the plurality of regions are defined in the input region.

10. The electronic device of claim 9, wherein the noise information included in the image information data is information on an image of one frame to be displayed in the input region.

11. The electronic device of claim 7, wherein the sensor driver is configured to change a frequency of the output signal based on the image information data.

12. The electronic device of claim 11, wherein the output signal whose frequency has been changed is provided to the sensor layer in the second mode.

13. The electronic device of claim 11, wherein the sensor driver is configured to change an operation time of each of the first mode and the second mode based on the image information data.

14. An interface device comprising:
an electronic device including a display layer configured to display an image based on image data, a sensor layer on the display layer, a display driver configured to drive the display layer, a sensor driver configured to drive the sensor layer, and a main controller configured to control the display driver and the sensor driver; and
an input device configured to receive an up-link signal from the sensor layer and to output a down-link signal to the sensor layer, wherein:
the sensor driver is configured to operate in a first mode for sensing an input by the input device or in a second mode for sensing an input by a touch;
the sensor driver is configured to receive image information data calculated based on the image data; and
the sensor driver is configured to generate an output signal provided to the sensor layer based on the image information data.

15. The interface device of claim 14, wherein, in the first mode, the output signal is the up-link signal; and the sensor driver is configured to output the up-link signal including image information data to the sensor layer.

16. The interface device of claim 15, wherein the input device is configured to receive the up-link signal, and to output the down-link signal.

17. The interface device of claim 14, wherein, in the second mode, the sensor driver is configured to change a frequency of the output signal based on the image information data, and the sensor driver is configured to output the output signal whose frequency has been changed to the sensor layer.

18. The interface device of claim 14, wherein the display driver is configured to provide the image information data to the sensor driver.

19. The interface device of claim 14, wherein the main controller is configured to provide the image information data to the sensor driver.

20. The interface device of claim 14; wherein the display layer has a plurality of regions, the image information data includes noise information on the image; and the noise information is calculated based on the plurality of regions.

* * * * *

UNITED STATES PATENT AND TRADEMARK OFFICE
CERTIFICATE OF CORRECTION

PATENT NO.        : 11,561,643 B2
APPLICATION NO.   : 17/221714
DATED             : January 24, 2023
INVENTOR(S)       : Yun-Ho Kim et al.

It is certified that error appears in the above-identified patent and that said Letters Patent is hereby corrected as shown below:

On the Title Page

(72) Inventors, 2nd inventor      Delete "Chui" and
Insert -- Chul --

In the Claims

Column 26, Line 1, Claim 15      Delete "signal;" and
Insert -- signal, --

Column 26, approx. Line 20, Claim 20      Delete "14;" and
Insert -- 14, --

Column 26, approx. Line 22, Claim 20      Delete "image;" and
Insert -- image, --

Signed and Sealed this
Ninth Day of April, 2024

*Katherine Kelly Vidal*

Katherine Kelly Vidal
*Director of the United States Patent and Trademark Office*